(12) United States Patent
Ifuku et al.

(10) Patent No.: US 7,804,231 B2
(45) Date of Patent: Sep. 28, 2010

(54) EPITAXIAL OXIDE FILM, PIEZOELECTRIC FILM, PIEZOELECTRIC FILM ELEMENT, LIQUID DISCHARGE HEAD USING THE PIEZOELECTRIC FILM ELEMENT, AND LIQUID DISCHARGE APPARATUS

(75) Inventors: Toshihiro Ifuku, Yokohama (JP);
Katsumi Aoki, Yokohama (JP);
Takanori Matsuda, Tokyo (JP); Hiroshi Funakubo, Yokohama (JP); Shintaro Yokoyama, Yokohama (JP); Yong Kwan Kim, Yokohama (JP); Hiroshi Nakaki, Yokohama (JP); Rikyu Ikariyama, Yokohama (JP)

(73) Assignees: Canon Kabushiki Kaisha, Tokyo (JP);
Tokyo Institute of Technology, Tokyo (JP)

( * ) Notice: Subject to any disclaimer, the term of this patent is extended or adjusted under 35 U.S.C. 154(b) by 27 days.

(21) Appl. No.: 11/677,267

(22) Filed: Feb. 21, 2007

(65) Prior Publication Data
US 2008/0012054 A1    Jan. 17, 2008

Related U.S. Application Data

(63) Continuation of application No. PCT/JP2006/317944, filed on Sep. 5, 2006.

(30) Foreign Application Priority Data

Sep. 5, 2005    (JP)    ............................. 2005-257133
Mar. 20, 2006    (JP)    ............................. 2006-076667
Aug. 28, 2006    (JP)    ............................. 2006-231238

(51) Int. Cl.
*H01L 41/187*    (2006.01)

(52) U.S. Cl. ...................................... 310/358; 257/295

(58) Field of Classification Search ................. 310/358; 257/295
See application file for complete search history.

(56) References Cited

U.S. PATENT DOCUMENTS 6,198,208 B1 *    3/2001    Yano et al. .................. 310/358

(Continued)

FOREIGN PATENT DOCUMENTS

JP    10-45470 A    2/1998

(Continued)

OTHER PUBLICATIONS

Journal of Crystal Growth 171 (1997) 401-408 Xin Wang, Ulf Helmersson, Jens Birch, Wei-Zin Ni High resolution X-ray diffraction mapping studies on the domain structure of LaAlo3, single crystal substrates and its influence on SrTiO3 film growth.*

(Continued)

*Primary Examiner*—Walter Benson
*Assistant Examiner*—Bryan P Gordon
(74) *Attorney, Agent, or Firm*—Fitzpatrick, Cella, Harper & Scinto

(57) ABSTRACT

Provided are a piezoelectric film, a piezoelectric film element, a liquid discharge head using the piezoelectric film element, and a liquid discharge apparatus. A piezoelectric film element that can be suitably used for a discharge pressure-generating element of a liquid discharge head is obtained by using an epitaxial oxide film composed of a perovskite composite oxide constituted according to a general formula $ABO_3$ as a piezoelectric film. The epitaxial oxide film has at least an A domain and a B domain having a crystal orientation deviation with respect to each other. The crystal orientation deviation between the A domain and the B domain is less than 2°.

23 Claims, 24 Drawing Sheets

U.S. PATENT DOCUMENTS

| | | |
|---|---|---|
| 6,854,832 B2 | 2/2005 | Matsuda |
| 7,309,950 B1 | 12/2007 | Aoki et al. |
| 2004/0232803 A1 | 11/2004 | Matsushita et al. |
| 2005/0189571 A1* | 9/2005 | Karasawa et al. ............ 257/213 |
| 2006/0012648 A1 | 1/2006 | Ifuku et al. |
| 2006/0017086 A1* | 1/2006 | Kanaya et al. .............. 257/296 |
| 2006/0256167 A1 | 11/2006 | Ifuku et al. |
| 2007/0004226 A1* | 1/2007 | Tweet et al. ................. 438/778 |
| 2007/0046153 A1 | 3/2007 | Matsuda et al. |
| 2007/0046734 A1 | 3/2007 | Aoki et al. |
| 2007/0060467 A1 | 3/2007 | Matsuda et al. |
| 2007/0090728 A1 | 4/2007 | Matsuda et al. |
| 2008/0012909 A1 | 1/2008 | Matsuda et al. |
| 2008/0012910 A1 | 1/2008 | Matsuda et al. |

FOREIGN PATENT DOCUMENTS

| | | |
|---|---|---|
| JP | 3397538 B2 | 2/2003 |
| JP | 2004-249729 A | 9/2004 |
| JP | 2005-5698 A | 1/2005 |

OTHER PUBLICATIONS

Singh et al., "Crystalline Properties of Ferroelectric—Relaxor PMN-PT Thin Films by Pulsed Laser Deposition," Applications of Ferroelectrics, 2002, ISAF 2002, Proceedings of the 13$^{th}$ IEEE International Symposium, pp. 133-136.

Smits et al., "The Constituent Equations of Piezoelectric Heterogeneous Bimorphs," IEEE Transactions on Ultrasonics, Ferroelectrics, and Frequency Control, vol. 38, No. 3, May 1991, pp. 256-270.

International Preliminary Report on Patentability and translation in PCT Application No. PCT/JP2006/317944 dated Mar. 11, 2008.

"Ceramics Dielectric Substance Engineering," 4th edition, Jun. 1, 1992, Gakkensha, p. 333, and partial English-language translation.

"Ceramics," vol. 40 (8), 2005, p. 600, and partial English-language translation.

Ifuku et al, U.S. Appl. No. 12/031,176, filed Feb. 14, 2008.

* cited by examiner

DIFFRACTION CAUSED BY A DOMAIN

DIFFRACTION CAUSED BY B DOMAIN

DIFFRACTION CAUSED BY B DOMAIN

EPITAXIAL OXIDE FILM, PIEZOELECTRIC FILM, PIEZOELECTRIC FILM ELEMENT, LIQUID DISCHARGE HEAD USING THE PIEZOELECTRIC FILM ELEMENT, AND LIQUID DISCHARGE APPARATUS

This application is a continuation of International Application No. PCT/JP2006/317944 filed on Sep. 5, 2006, which claims the benefit of Japanese Patent Application No. 2005-257133 filed on Sep. 5, 2005, Japanese Patent Application No. 2006-076667 filed on Mar. 20, 2006 and Japanese Patent Application No. 2006-231238 filed on Aug. 28, 2006.

BACKGROUND OF THE INVENTION

1. Field of the Invention

The present invention relates to an epitaxial oxide film, a piezoelectric film, a piezoelectric film element, a liquid discharge head using the piezoelectric film element, and a liquid discharge head to be used particularly in a liquid discharge apparatus.

2. Description of the Related Art

A piezoelectric actuator can reduce a size of a motor structure and can increase density of the structure. Accordingly, the piezoelectric actuator has been recently attracting attention in a field of a portable information device and in chemical and medical fields because of its potential to serve as a new motor replacing an electromagnetic motor. Upon driving of the piezoelectric actuator, the piezoelectric actuator generates no electromagnetic noise, and is not affected by noise from any other device. Further, the piezoelectric actuator has been attracting attention because of its potential to serve as a technique for producing a device having a sub-millimeter size, which is typified by a micromachine. Accordingly, a fine piezoelectric substrate element as a driving source for the piezoelectric actuator has been demanded.

A piezoelectric substrate element is generally constituted in such a manner that a pair of electrodes are connected to a piezoelectric substance. The piezoelectric substance is generally produced by molding a material having piezoelectric property, such as the sintered body or single crystal body of a bulk material subjected to a heat treatment, into a fine piece having a desired size and a desired thickness by a processing technique such as cutting or grinding. In addition, an approach generally adopted upon formation of the fine piezoelectric substrate element involves: applying a piezoelectric substance in a green sheet shape to a predetermined position on a substrate made of a metal, silicon, or the like by a method such as a printing method; and sintering the resultant to form a piezoelectric substrate element directly. The article molded from the green sheet as described above has a thickness of about several tens of micrometers to several hundreds of micrometers, and the upper and lower portions of the piezoelectric substance are provided with electrodes so that voltage can be applied through the electrodes.

A piezoelectric substance for use in a small piezoelectric substrate element to be used in a liquid discharge head has also been conventionally produced by: molding the above-mentioned material into a fine piece by a processing technique such as cutting or grinding as described above; or using a piezoelectric substance in a green sheet shape. An example of a device using such the piezoelectric substrate element is a liquid discharge head having a unimolph type piezoelectric substrate element structure. The liquid discharge head includes a pressure chamber in communication with an ink supply chamber and an ink discharge port in communication with the pressure chamber. The liquid discharge head is constituted in such a manner that the pressure chamber is provided with a vibration plate onto which a piezoelectric substrate element is joined or directly formed. Predetermined voltage is applied to the piezoelectric substrate element in such the constitution to expand and contract the piezoelectric substrate element, whereby flexural oscillation is generated to compress ink in the pressure chamber. As a result, an ink liquid droplet is discharged from the ink discharge port.

A color ink jet printer utilizing the above-mentioned function of a piezoelectric substance has currently become widespread. However, an improvement in printing performance of such the printer according to a piezoelectric mode, in particular, an improvement in resolution or printing speed has been requested. To cope with the demand, an attempt has been made to realize improvements in resolution and printing speed by using a multi-nozzle head structure obtained by reducing the size of a liquid discharge head. A reduction in size of a liquid discharge head requires an additional reduction in size of a piezoelectric substrate element for discharging ink. Further, recently, an attempt has also been actively made to apply a liquid discharge head to industrial applications such as the direct drawing of wiring. At the time of the application, an additional reduction in size of an discharge pressure-generating element structure pattern of a liquid discharge head having an additionally wide variety of properties, and an additional improvement in performance of the head have been requested.

Due to the recent development of a micromachine technique, research has been conducted on the development of an ultra-small piezoelectric substrate element with additionally high accuracy by putting a microprocessing technique used for a semiconductor to full use after the formation of a piezoelectric substance as a thin film. In particular, a piezoelectric film formed by a thin film method such as a sputtering method, a chemical vapor phase synthesis method, a sol-gel method, a gas deposition method, or a pulsed laser deposition method generally has a thickness of about several hundreds of nanometers to several tens of micrometers when the piezoelectric film is applied to a piezoelectric actuator. An electrode is connected to the piezoelectric film so that voltage can be applied through the electrode.

Meanwhile, research on a high-performance piezoelectric material showing additionally large piezoelectric property has also been actively conducted in association with a reduction in size of a piezoelectric substrate element. A piezoelectric material that has been attracting attention in recent years is a composite oxide material having a perovskite type structure represented by a general formula $ABO_3$. The material typified by, for example, $Pb(Zr_xTi_{1-x})O_3$ (lead zirconate titanate: PZT) shows excellent ferroelectricity, pyroelectricity, and piezoelectricity. Examples of a PZT material include such materials as described in "Ceramic Dielectric Substance Engineering", fourth edition, published on the first day of June, 1992, Gakkensha, p. 333.

In view of the foregoing, investigation has been conducted on the formation of such a piezoelectric substance as a film by employing a thin film method such as a sputtering method, a chemical vapor phase synthesis method, a sol-gel method, a gas deposition method, or a pulsed laser deposition method. However, at present, the formation of a piezoelectric substrate (piezoelectric film) from such a material having high piezoelectricity as described above by a thin film formation method has not reached realization of piezoelectricity as high as one intrinsically expected, and a difference between piezoelectricity obtained as a result of the formation and that intrinsically expected is extremely large. Further, a suitable piezoelectric film element capable of avoiding, for example, electrode peeling mainly piezoelectric distortion generated by an improvement in piezoelectricity or film peeling upon formation of the piezoelectric film element directly on a substrate has not been established yet.

It should be noted that investigation has been conducted on the formation of a piezoelectric film from a relaxor material by employing a thin film method such as a sputtering method, a chemical vapor phase synthesis method, a sol-gel method, a gas deposition method, or a pulsed laser deposition method. For example, Applications of Ferroelectrics, 2002. ISAF 2002. Proceedings of the 13th IEEE International Symposium P 133-136 reports that a PMN-PT thin film was formed by a pulsed laser deposition (PLD) method.

Incidentally, the inventors of the present invention have shown in Japanese Patent Application Laid-Open No. 2004-249729 that, when a piezoelectric film has a twin crystal, piezoelectricity is improved and adhesiveness between the piezoelectric film and a lower electrode or an upper electrode is improved. One of the reasons for this is as follows: when the piezoelectric film has a twin crystal, internal stresses generated upon production of materials by various production methods can be alleviated by a twin crystal structure. It is considered that, as a result of the alleviation, piezoelectricity close to that of a piezoelectric substance obtained by using a bulk material is shown, and a piezoelectric substrate element having good adhesiveness between the piezoelectric film and the lower electrode or the upper electrode can be obtained.

SUMMARY OF THE INVENTION

An object of the present invention is to solve the above-mentioned problems and to provide a piezoelectric film which has large piezoelectricity and a piezoelectric film element using the piezoelectric film. Further, another object of the present invention is to provide an oxide film which has a novel structure and which can be used as a functional film in any one of various fields such as the field of an optical instrument. Still further, another object of the present invention is to provide a suitable piezoelectric film element capable of avoiding, for example, electrode peeling mainly caused by large piezoelectric distortion or film peeling upon direct formation of the piezoelectric film element directly on a substrate. Another object of the present invention is to provide a liquid discharge head capable of: stably providing high discharge performance; and reducing the size of the discharge pressure-generating element structure pattern including a piezoelectric film element, and a liquid discharge apparatus having the liquid discharge head.

According to one aspect of the present invention, there is provided an epitaxial oxide film composed of a perovskite composite oxide represented by a general formula $ABO_3$, including at least an A domain and a B domain having a crystal orientation deviation with respect to each other, in which the crystal orientation deviation between the A domain and the B domain is less than 5°.

According to another aspect of the present invention, there is provided an epitaxial oxide film with a <100> orientation having at least a tetragonal, the epitaxial oxide film being composed of a perovskite composite oxide represented by a general formula $ABO_3$, the epitaxial oxide film including at least an A domain, a B domain, a C domain, and a D domain having a crystal orientation deviation with respect to one another, in which: each of the A domain and the B domain has a [001] orientation and each of the C domain and the D domain has a orientation; the A domain and the C domain have at least a mirror image relation of a twin crystal, and a twin crystal plane of the twin crystal is {110}; and the B domain and the D domain have at least a mirror image relation of a twin crystal, and a twin crystal plane of the twin crystal is {110}.

According to still another aspect of the present invention, there is provided a piezoelectric film composed of an epitaxial oxide film composed of a perovskite composite oxide represented by a general formula $ABO_3$, the epitaxial oxide film including at least an A domain and a B domain having a crystal orientation deviation with respect to each other, in which the crystal orientation deviation between the A domain and the B domain is less than 5°.

According to still another aspect of the present invention, there is provided a piezoelectric film composed of epitaxial oxide film with a <100> orientation having at least a tetragonal and a perovskite composite oxide represented by a general formula $ABO_3$, the epitaxial oxide film including at least an A domain, a B domain, a C domain, and a D domain having a crystal orientation deviation with respect to one another, in which: each of the A domain and the B domain has a [001] orientation and each of the C domain and the D domain has a [100] orientation; the A domain and the C domain have at least a mirror image relation of a twin crystal, and a twin crystal plane of the twin crystal is {110}; and the B domain and the D domain have at least a mirror image relation of a twin crystal, and a twin crystal plane of the twin crystal is {110}.

A piezoelectric film element of the present invention is a piezoelectric film element characterized by including the piezoelectric film with the above constitution and a pair of electrodes in contact with the piezoelectric film.

A liquid discharge head includes: a discharge port, a separate liquid chamber in communication with the discharge port, a piezoelectric substrate element provided in correspondence with the separate liquid chamber, and a vibration plate provided between the separate liquid chamber and the piezoelectric substrate element, the liquid discharge head discharging a liquid in the separate liquid chamber from the discharge port due to a volume change in the separate liquid chamber caused by the vibration plate, in which the piezoelectric substrate element includes the piezoelectric film element with the above constitution.

A liquid discharge apparatus of the present invention is a liquid discharge apparatus characterized by including the liquid discharge head with the above constitution.

According to the present invention, there can be provided a piezoelectric film element having large piezoelectricity and capable of avoiding, for example, electrode peeling in the piezoelectric film element mainly caused by large piezoelectric distortion or film peeling upon formation of the piezoelectric film element directly on a substrate, and a piezoelectric film for use in the piezoelectric film element. Further, the use of the piezoelectric film element can provide a liquid discharge head showing high uniform discharge performance and capable of additionally reducing the size of an discharge pressure-generating element structure pattern, and a liquid discharge apparatus having the liquid discharge head. In addition, according to the present invention, there can be provided an epitaxial oxide film which has a novel structure and which can be used in any one of various fields such as the field of an optical instrument.

Further features of the present invention will become apparent from the following description of exemplary embodiments with reference to the attached drawings.

DESCRIPTION OF THE EMBODIMENTS

Figure 1A:
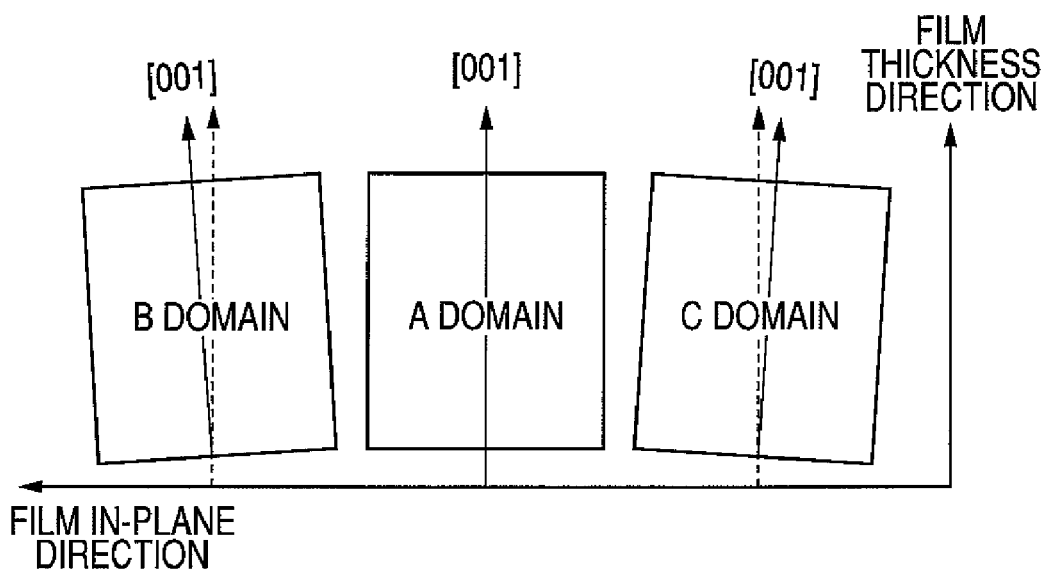
FIGS. 1A and 1B are a schematic view of a domain structure of an epitaxial oxide film of the present invention and a schematic pole figure obtained as a result of X-ray diffraction of the epitaxial oxide film, respectively.

A possible reason for the fact that a piezoelectric film element of the present invention has excellent characteristics is that a complicated structure is present in an epitaxial film having crystal orientation. In general, the application of an electric field in the spontaneous polarization direction of a piezoelectric substance made of a bulk body single crystal may provide high piezoelectric property. In recent years, research has been conducted on the performance of domain control called domain engineering as one measure for an improvement in piezoelectricity of a piezoelectric material. A known example of a relaxor single crystal material is {Pb$(Zn_{1/3}Nb_{2/3})O_3$}$_{1-X}$—(PbTiO$_3$)$_X$ (lead zincate niobate titanate: PZN-PT). It has been reported that a piezoelectric constant is significantly improved by performing domain control called an engineered domain structure in the relaxor single crystal material. That is, Ceramics, Vol 40 (8), 2005, P. 600 (Reference Document 1) reports that a piezoelectric constant 30 or more times as high as a piezoelectric constant $d_{33}$ in a spontaneous polarization direction (2,500-2,800 pC/N) can be obtained in the material.

Reference Document 1 reports that a reduction in domain size is one effective way of improving piezoelectricity by performing domain control. The use of domain engineering can provide piezoelectric displacement larger than polarization displacement intrinsic to a material on the basis of: the phase transformation of a crystal in association with the application of an electric field; or the rotation of a domain not horizontal to the electric field (such as a domain having polarization in the direction substantially perpendicular to the electric field). However, the expression of such piezoelectric displacement requires extremely high energy. Accordingly, a domain structure which may induce the phase transformation of a crystal or the rotation of a domain in a piezoelectric material is important for a reduction in energy of piezoelectric displacement in a piezoelectric material to which domain engineering is applied.

A reduction in domain size allows a domain to have a minute fluctuation, whereby the energy of piezoelectric displacement due to domain engineering reduces. Such control that a domain is brought into a state where the domain has the above-mentioned minute fluctuation is particularly important for obtaining large piezoelectric displacement by applying domain engineering particularly in a thin film in which a film stress is large or the number of lattice defects is large.

In other words, the piezoelectric film element of the present invention has high piezoelectricity probably because a structure having such small domain size as described above can be realized in a piezoelectric film as an epitaxial oxide film in which the piezoelectric film has a complicated structure. The complicated structure possessed by the piezoelectric film of the present invention is a structure in which a domain having an extremely small crystal orientation deviation with respect to a certain domain is present. The presence of the domain can induce the phase transformation of a crystal or the rotation of a domain in a piezoelectric substance, so the energy of piezoelectric displacement due to domain engineering reduces. As a result, the piezoelectric film element can have high piezoelectricity. In addition, at the same time, a film stress received by an epitaxial oxide film as a piezoelectric film to be formed on a substrate can be alleviated by the complicated structure of the present invention. Accordingly, a piezoelectric film element capable of avoiding, for example, electrode peeling mainly caused by large piezoelectric distortion or film peeling upon formation of the piezoelectric film element directly on a substrate may probably be obtained.

Further, the piezoelectric film of the present invention can have a complicated structure having at least an A domain, a B domain, a C domain, and a D domain. In this case, a film stress received by an epitaxial oxide film as a piezoelectric film to be formed on a substrate may be alleviated by the complicated structure itself. This is probably a reason for the fact that the piezoelectric film element of the present invention is capable of not only avoiding, for example, electrode peeling mainly caused by large piezoelectric distortion or film peeling upon formation of the piezoelectric film element directly on a substrate, but is also capable of having large piezoelectricity.

An epitaxial oxide film of the present invention is composed of a perovskite composite oxide represented by a general formula $ABO_3$, and has the above-mentioned complicated structure. As described above, the epitaxial oxide film can be suitably used as a piezoelectric film to be incorporated into a piezoelectric film element.

The epitaxial oxide film of the present invention can be used in applications including optical elements such as an optical switching element in addition to the above-mentioned piezoelectric application. A film having good piezoelectric property can generally be used in an optical element because of its large change in refractive index. In addition, the oxide film of the present invention, which is an epitaxial film, can provide a film having good transparency depending on the selection of material composition. A preferable film thickness when the oxide film is used in an optical element is 0.6 μm or more to 20 μm or less; and a preferable film thickness when the oxide film is used as a piezoelectric film is 0.6 μm or more to 10 μm or less.

(Piezoelectric Film Element)

Figure 10:
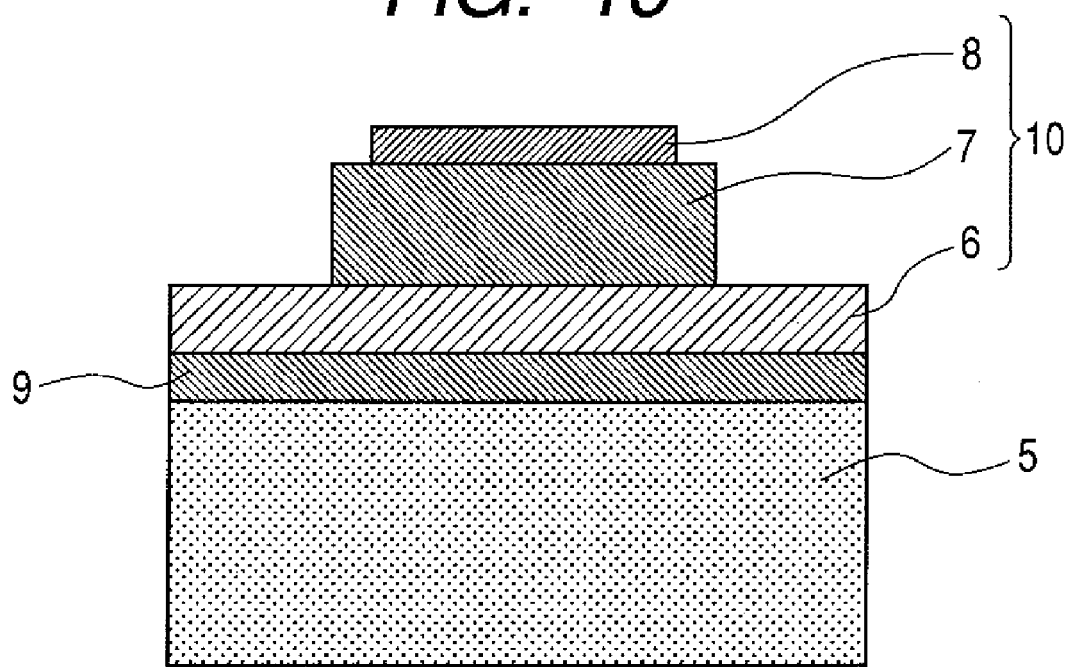
FIG. 10 is a schematic sectional view of an example of an embodiment of a piezoelectric film element.

Hereinafter, the constitution of a piezoelectric film element using the epitaxial oxide film as a piezoelectric film will be described. FIG. 10 shows a schematic sectional view of an example of an embodiment of the piezoelectric film element of the present invention. A piezoelectric film element 10 has at least a first electrode film 6, a piezoelectric film 7 according to the present invention, and a second electrode film 8. In the piezoelectric substrate element of the embodiment shown in FIG. 10, the shown sectional shape of the piezoelectric film element 10 is a rectangle, but the sectional shape may be a trapezoid or an inverted trapezoid. The piezoelectric film element 10 is formed on a substrate 5. Each of the first electrode film 6 and the second electrode film 8 constituting the piezoelectric film element 10 may be either a lower electrode or an upper electrode. The reason for the foregoing is due to a production method upon turning of the piezoelectric film element into a device, and an effect of the present invention can be obtained irrespective of whether the electrode films are a lower electrode or an upper electrode. In addition, a buffer layer 9 may be present between the substrate 5 and the first electrode film 6. The piezoelectric film element 10 can be produced by: forming the first electrode film 6 on at least one of the substrate 5 and the buffer layer 9 formed on the substrate 5; forming the piezoelectric film 7 on the first electrode film 6; and forming the second electrode film 8 on the piezoelectric film 7.

(Piezoelectric Film)

The piezoelectric film in the present invention is an epitaxial film composed of a perovskite composite oxide represented by the general formula $ABO_3$. Any material can be used as long as a piezoelectric film as a target of the present invention can be constituted. Examples of such material include ferroelectric materials each showing ferroelectricity, pyroelectricity, and piezoelectricity and typified by $PbTiO_3$ (lead titanate: PTO). The examples further include relaxor state of electrostrictive materials each showing excellent piezoelectricity and typified by $Pb(Zn_xNb_{1-x})O_3$ (lead zincate niobate: PZN). In particular, some of those materials may have crystalline phase boundaries each referred to as MPB. It is generally known that the piezoelectricity of an MPB region is particularly good. Examples of such materials include ferroelectric materials and relaxor state of electrostrictive materials such as lead zirconate titanate (PZT), lead zincate niobate titanate (PZN-PT), and lead magnesate niobate titanate (PMN-PT) represented by the following formulae.

PZT: $Pb(Zr_xTi_{1-x})O_3$

PZN-PT: $\{Pb(Zn_{1/3}Nb_{2/3})O_3\}_{1-X}-(PbTiO_3)_X$

PMN-PT: $\{Pb(Mg_{1/3}Nb_{2/3})O_3\}_{1-X}-(PbTiO_3)_X$

Here, for example, lead titanate is represented as $PbTiO_3$. However, the composition of each element may have a slight compositional deviation in film formation. Lead titanate having a compositional deviation such as $Pb_{1.2}TiO_{2.7}$ is permitted as long as the piezoelectric film is an epitaxial film composed of a perovskite composite oxide constituted according to the general formula $ABO_3$. In addition, X represents a number of 0 or more to 1 or less. In the case of, for example, PZT, an MPB region is generally present in the range of X of 0.4 to 0.7. In the case of PZN-PT, an MPB region is generally present in the range of X of 0.05 to 0.3. In the case of PMN-PT, an MPB region is generally present in the range of X of 0.2 to 0.4. Further, the piezoelectric film in the present invention may be made of a material except the above-mentioned lead-based materials. Examples of the material except the lead-based materials include $BaTiO_3$ (barium titanate: BTO) and $LiNbO_3$ (lithium niobate: LNO). The examples further include non-lead materials that have been attracting attention in recent years, such as $BiFeO_3$ (bismuth ferrate) and $BiCoO_3$ (bismuth cobalt oxide). PMN-PZT obtained by replacing Zr of PMN-PT with Ti, or a material obtained by doping any one of the above-mentioned materials with a trace amount of an element, such as $(Pb, La)(Zr_xTi_{1-x})O_3$ (PLZT) may also be used.

(Domain and Method of Observing it)

In addition, the piezoelectric film in the present invention has, in itself, at least an A domain and a B domain having a crystal orientation deviation with respect to each other, and the crystal orientation deviation between the A domain and the B domain is less than 2°. The term "domains" as used herein refers to minute crystalline regions identical to each other in lattice constant and crystal orientation and present in the piezoelectric film. The A domain and the B domain in the present invention can be easily identified by employing X-ray diffraction. For example, let us consider the case where a tetragonal PZT film with a [001] orientation has the A domain (represented by A in each figure) and the B domain (represented by B in each figure) as shown in FIG. 1A. It should be noted that the symbols "A" and "B" of domains are used for distinguishing two kinds of domains, and do not mean an "A" component and a "B" component in the general formula $ABO_3$ showing the constitution of a perovskite type composite oxide.

Figure 1B:
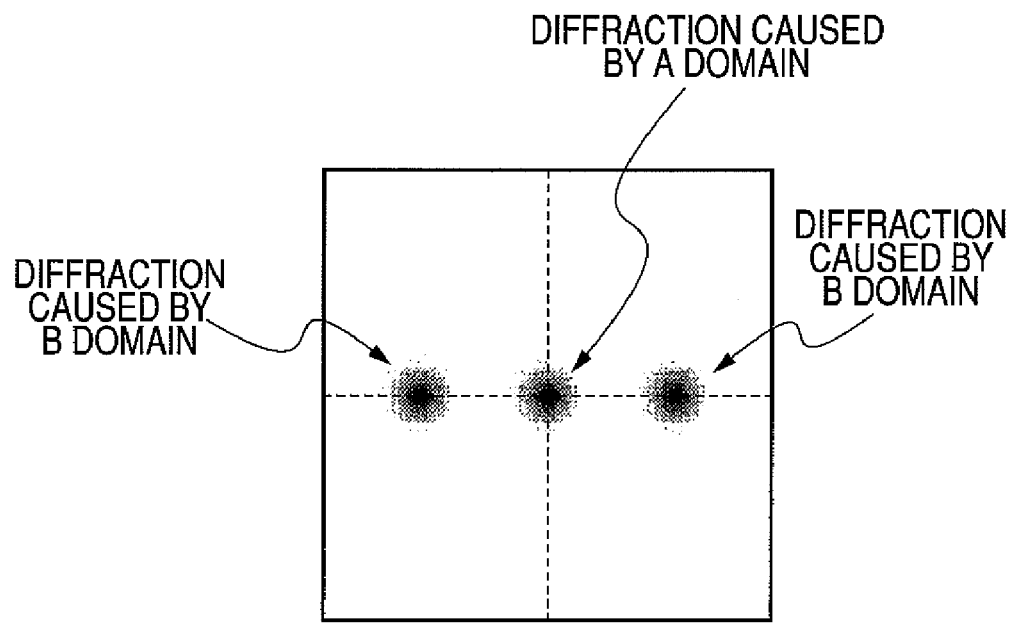
Figure 2:
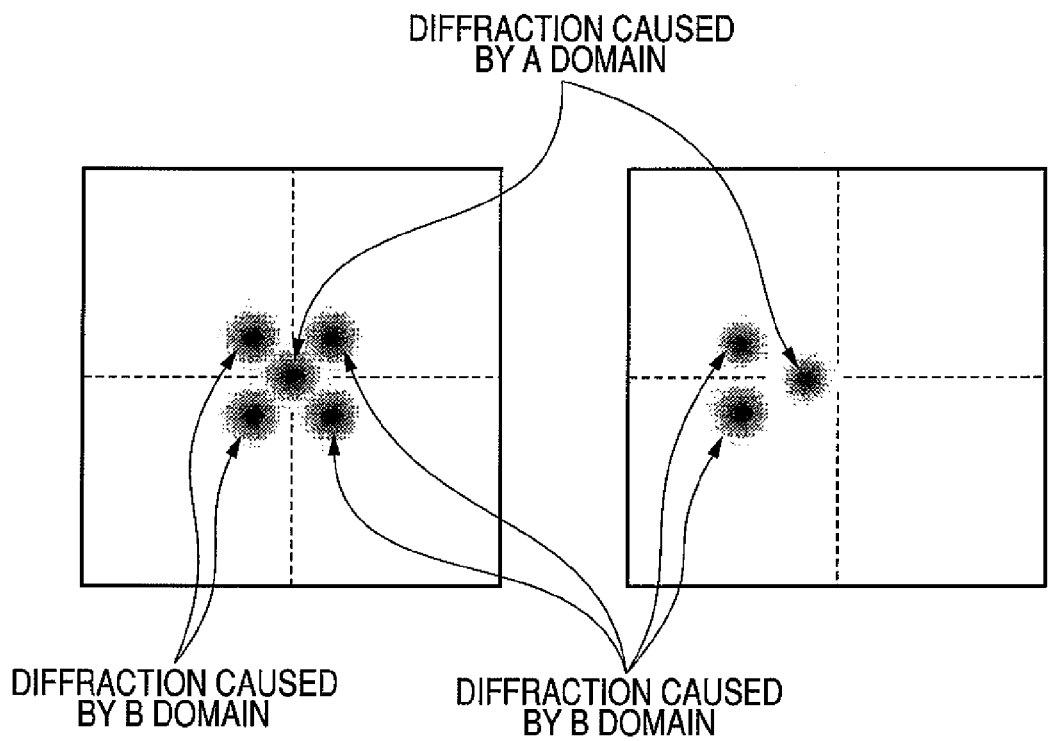
FIG. 2 is a schematic pole figure obtained as a result of the X-ray diffraction of the epitaxial oxide film of the present invention.

In the structure shown in FIG. 1A as a sectional view in a film thickness direction, for example, the diffraction angle of (004) of PZT is obtained around 96° in terms of 2θ in X-ray diffraction (when a Kα ray of Cu is used as an X-ray source). In this case, when pole measurement is performed at an inclination of up to 2° from the film thickness direction of a piezoelectric film ([004] direction of PZT) with 2θ fixed at the diffraction angle of (004) around 96°, diffraction points as shown in FIG. 1B are obtained. Here, the number of the B domains each having a crystal orientation deviation of less than 2° with respect to the A domain may be two or more. In addition, when the half value width of a domain (fluctuation of a crystal orientation) is large, or when the crystal orientation deviation between the A domain and the B domain is extremely small, the diffraction points of the A domain and the B domain may be superimposed on each other. Even when diffraction points are superimposed on each other as described above, the diffraction points may be regarded as separate domains in the range where the peak tops of the respective diffraction points can be observed (range where peaks can be separated from each other). In addition, examples of the diffraction points obtained by the pole measurement of the A domain and the B domain of the present invention include those shown in FIG. 2 in addition to those shown in FIG. 1B.

(Structure having Multiple Domain Pairs)

The piezoelectric film (epitaxial oxide film) according to the present invention may further have a combination (pair) of a C domain (represented by C in each figure) and a D domain (represented by D in each figure) in addition to the combination (pair) of the A domain and the B domain. The C domain and the D domain can be distinguished from each other by the same method as that described above. It should be noted that, since the crystal orientation deviation between domains in the present invention is less than 2°, the observation of a domain by X-ray diffraction requires measurement with high angular resolution. In view of the foregoing, the A domain and the B domain, or the C domain and the D domain, in the present invention are preferably distinguished from each other by employing X-ray diffraction, though they can be judged with a TEM or the like. It is preferable that: an X-ray diffraction instrument having a multi-axial goniometer be used as a measuring device for X-ray diffraction; and a solar slit having a longitudinal divergence of 0.01 radian (Rad.) or less and a lateral divergence of 0.01 Rad. or less be inserted in front of a detector for a diffracted X-ray. Examples of a device that can be suitably used as an X-ray diffraction instrument having a multi-axial goniometer include an X-ray diffraction instrument X'Pert MRD (trade name) manufactured by PANalytical and an X-ray diffraction instrument ATX-E (trade name) manufactured by Rigaku Corporation. Further, in a multi-axial goniometer, the scanning accuracy of a rotational angle (generally a φ axis) to be scanned upon pole measurement is generally inferior to the scanning accuracy of 2θ/θ measurement (generally a 2θ axis) in many cases. In view of the foregoing, when a range of about several degrees is subjected to pole measurement like the present invention, pole measurement with high angular resolution can be performed by scanning a tilting angle (generally an ω axis and a φ axis).

The combination of the A domain and the B domain and the combination of the C domain and the D domain of the present invention have been described above. However, for example, the A domain and any other domain except the B domain may establish such a relationship that the crystal orientation deviation between them is less than 2°. In addition, in the same manner, the C domain and any other domain except the D domain may establish such a relationship that the crystal orientation deviation between them is less than 2°.

In addition, when the crystal orientation deviation between the A domain and the B domain is represented by X° and the crystal orientation deviation between the C domain and the D domain is represented by Y°, the piezoelectric film in the present invention preferably satisfies the relationship of X=Y. This relationship shows that the B domain and the D domain have crystal orientation deviations caused by the same reason with respect to the A domain and the C domain. In the case of, for example, PZT, the foregoing state may occur when the B domain and the D domain of a rhombohedral or a monoclinic are present next to the A domain and the C domain of a tetragonal. Alternatively, the foregoing state may occur when the B domain and the D domain having the same mirror image relation of a twin crystal are present next to the A domain and the C domain as described below. Such piezoelectric film has a more preferable domain structure because the domain control of the film by controlling conditions for film formation can be more easily performed than domain control in the case where domains are indiscriminately present.

(Epitaxial Film)

Further, the piezoelectric film of the present invention is preferably an epitaxial film with a <100> orientation having at least a tetragonal. The reason for the foregoing is probably as follows: a tetragonal perovskite type composite oxide has a polarization direction of [001], and the piezoelectric film of the present invention will be of a structure suitable for means for improving piezoelectricity called domain engineering if the film is a tetragonal and has a <100> orientation. In other words, the reason for the foregoing is probably that most of the polarization directions of the domains constituting the piezoelectric film can be aligned in the film thickness direction of the film upon application of an electric field to a piezoelectric film element.

The term "epitaxial film" as used herein refers to a film having a single crystal orientation in its film thickness direction and its film in-plane direction by using the crystallinity of a substrate or a lower layer film (such as a lower electrode film). In other words, the complicated crystalline structure of the present invention is obtained when an in-plane direction is not randomly oriented. For example, strontium ruthenate (SRO) having a perovskite structure and PZT have close lattice constants each of which is about 4 Å. In view of the foregoing, when PZT or PTO is formed into a piezoelectric film on SRO with a <100> orientation formed into a lower electrode film, it becomes possible to form PZT or PTO with a <100> orientation depending on conditions for film formation. As described above, a film having a single crystal orientation in its film thickness direction and its film in-plane direction by using the crystallinity of a lower layer film (such as a lower electrode film) is an epitaxial film. The epitaxial oxide film of the present invention also has the above-mentioned single crystal orientation.

(Method of Observing Crystal Orientation)

Figure 3:
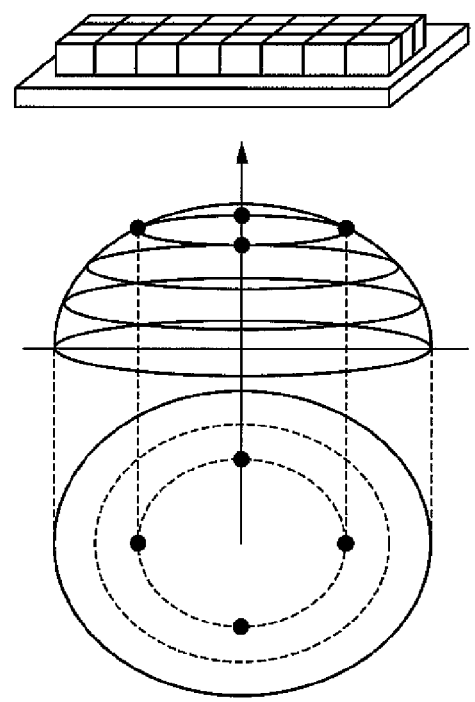
FIG. 3 is a schematic view of the epitaxial oxide film of the present invention and a schematic pole figure obtained as a result of the X-ray diffraction of the epitaxial oxide film.

The <100> orientation in the present invention can be easily identified by employing X-ray diffraction. In the case of, for example, tetragonal PZT with a <100> orientation, peaks to be detected caused by a piezoelectric film in the 2θ/θ measurement of X-ray diffraction are limited to the peaks of {L00} surfaces (L=1, 2, 3, ..., n: n represents an integer) such as {100} and {200}. In addition, upon pole measurement of a {110} asymmetric surface, the poles of the {110} asymmetric surface of each crystal are measured as a four-fold symmetric spot-like pattern at positions at an interval of 90° on a circumference corresponding to an inclination of about 45° from the film thickness direction of the piezoelectric film indicated by an arrow as shown in FIG. 3. The "film thickness direction" in this case is the direction of the normal to the {L00} surface of the crystal of the piezoelectric film.

(Definition of Crystal Orientation)

Here, <100> is the generic representation of a total of six orientations generally represented by, for example, [100], [010], and [001]. In the case of, for example, a cubic, [100] and [001] have the same meaning. On the other hand, in the case of a tetragonal or a rhombohedral, [100] and [001] must be distinguished from each other. However, the crystal of a perovskite composite oxide has a lattice constant close to that of a cubic even when the crystal is a tetragonal or a rhombohedral. Therefore, in the present invention, [100] and [001] of a tetragonal, and [111] and $$\overline{111} \quad \text{[Formula 1]}$$

of a rhombohedral are generically represented by <100> and <111>. It should be noted that $$\overline{1} \quad \text{[Formula 2]}$$

will hereinafter be represented as "1bar".

In the present invention, for example, tetragonal PZT has a <100> orientation having a single <100> crystal orientation even when [001] as a polarization direction and or [010] as a non-polarization direction are simultaneously present. In addition, in the present invention, even when multiple crystalline phases such as a tetragonal, a rhombohedral, and a monoclinic are mixed (multi-phase), even when a crystal caused by a twin crystal or the like is mixed, or even when a dislocation, a defect, or the like is present, the orientation in the present invention is regarded as a <100> orientation in a broad sense. The reason for the foregoing is as follows: even in the case where such phase or twin crystal is mixed, a <100> axis is inclined by only about 5° from a film thickness direction, so regarding the orientation as a <100> orientation is not insufficient for the expression of domain engineering. In other words, the term "<100> orientation" as used herein refers to the fact that a piezoelectric film has a single <100> crystal orientation in its film thickness direction. However, an axis having an inclination of up to about several degrees such as a <100> crystal axis inclined by about 5° from a film thickness direction is also referred to as a <100> orientation. Further, in the present invention, {110} is the generic representation of a total of six surfaces generally represented by, for example, (110), (101), and (011), and details about the generic representation are the same as the above-mentioned details about the handling of an orientation.

(Measurement of Crystalline Phase)

It should be noted that the crystalline phase of a piezoelectric film can be identified by the reciprocal lattice space mapping of X-ray diffraction. For example, when the piezoelectric film with a <100> orientation of PZT is a tetragonal, (004) and (204) are measured by reciprocal lattice space mapping. As a result, such reciprocal lattice points that a size Qy(004) of a (004) reciprocal lattice point in a y-axis direction and a size Qy(204) of a (204) reciprocal lattice point in the y-axis direction satisfy the relationship of Qy(004)=Qy(204) are obtained. For example, when the piezoelectric film is a rhombohedral, (004) and (204) are measured by reciprocal lattice space mapping. As a result, the size Qy(004) of the (004) reciprocal lattice point in the y-axis direction and the size Qy(204) of the (204) reciprocal lattice point in the y-axis direction satisfy the relationship of Qy(004)>Qy(204) or Qy(004)<Qy(204). That is, such reciprocal lattice points that the size Qy(004) of the (004) reciprocal lattice point in the y-axis direction and a size Qx(204) of (204) in an x-axis direction satisfy the relationship of Qy(004)÷2Qx(204) are obtained. In this case, such two (204) reciprocal lattice points that the relationship of Qy(004)>Qy(204) and the relationship of Qy(004)<Qy(204) are established may appear. The two reciprocal lattices probably have the relation of a twin crystal. Here, the y axis of a reciprocal lattice space is the film thickness direction of the piezoelectric film, and the x axis of the space is one certain direction among the film in-plane directions of the piezoelectric film.

(Twin Crystal)

Figure 4A:
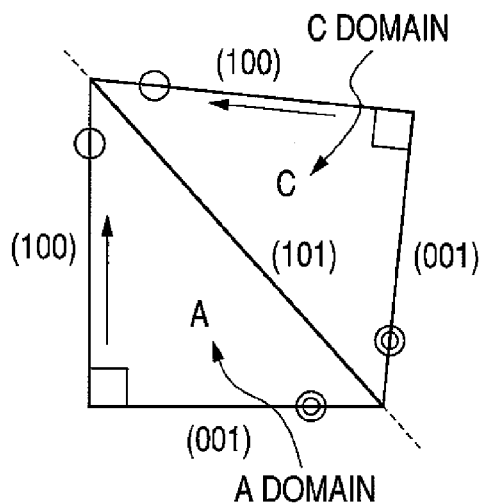
FIGS. 4A and 4B are each a view for explaining the domain structure of the epitaxial oxide film of the present invention.

In the piezoelectric film in the present invention, it is preferable that: the A domain and the C domain have at least a mirror image relation of a twin crystal; and the twin crystal plane of the twin crystal be {110}. In addition, it is more preferable that: the B domain and the D domain have at least a mirror image relation of a twin crystal; and the twin crystal plane of the twin crystal be {110}. A reason for the foregoing is probably as follows: when the polarization of the piezoelectric film is aligned in a [001] direction by, for example, domain switching, a large piezoelectric change can be produced by the contribution of the C domain or the D domain as shown by the model of FIG. 4A to be described below. In other words, the reason for the foregoing is probably as follows: when the piezoelectric film has such twin crystal, domain engineering capable of providing piezoelectric displacement larger than polarization displacement intrinsic to a material can be expressed due to the rotation of a domain having polarization in the direction substantially perpendicular to the film. Further, the piezoelectric film of the present invention probably has an additionally reduced domain size due to its complicated structure, and such domain switching seems to occur more easily in the film than in an ordinary twin crystal structure. Another reason for the foregoing contributing simultaneously with the above reason is probably as follows: such a structure that an internal stress generated upon production of a piezoelectric film element can be additionally easily alleviated is established due to the fact that the twin crystal plane of the twin crystal is {110}.

The twin crystal that can be used in the present invention is a crystal that establishes a mirror image relation by using a surface having a crystal constituting a piezoelectric film as a twin crystal plane. A representative example of the twin crystal that can be used in the present invention is a crystal having a mirror image relation as shown in FIG. 4A. FIG. 4A is a schematic view of the structure of a crystal which is a tetragonal, the structure having an A domain and a C domain. The A domain has (100) in the direction perpendicular to its film thickness direction. That is, the domain has a [001] crystal axis in its film thickness direction. In addition, the C domain has (100) in a direction slightly deviating from its film thickness direction. That is, the domain has a [001] crystal axis in a direction slightly deviating from its film in-plane direction. The A domain and the C domain have a mirror image relation of a twin crystal by using (101) as a twin crystal plane. The magnitude of the slight deviation in this case is comparable to a value obtained by subtracting 90° from an angle twice as large as an angle establishing a tangential relationship between the a-axis length and c-axis length of the crystal lattice of a tetragonal. In general, the unit cell of a perovskite composite oxide constituted according to the general formula $ABO_3$ is relatively close to a cube, so the above-mentioned slight deviation caused by a twin crystal is about several degrees. In addition, FIG. 4A shows that the A domain and the C domain have a crystal orientation deviation with respect to each other.

Figure 4B:
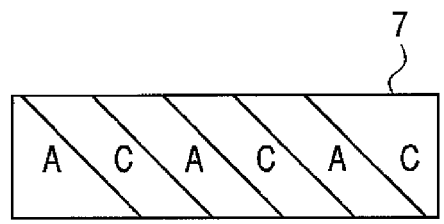
Figure 5A:
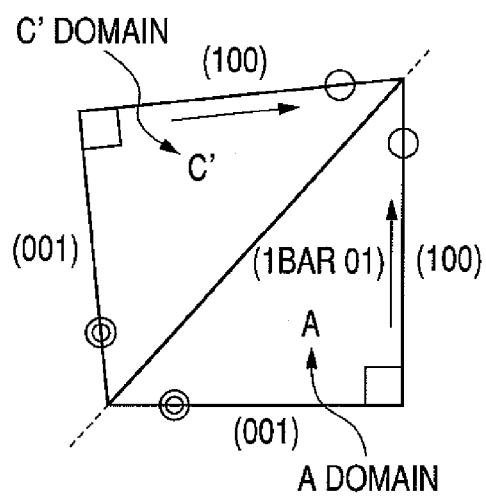
FIGS. 5A and 5B are each a view for explaining the domain structure of the epitaxial oxide film of the present invention.
Figure 5B:
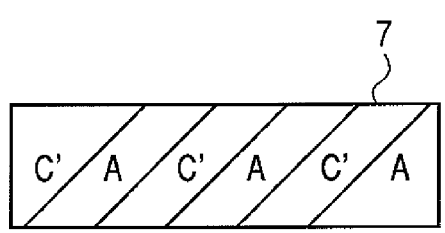
Figure 6:
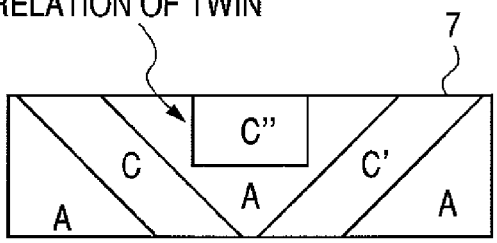
FIG. 6 is a view for explaining the domain structure of the epitaxial oxide film of the present invention.

FIG. 4B is an example of the schematic film sectional structure of the piezoelectric film 7 having the A domain and the C domain shown in FIG. 4A. In addition, FIG. 5A is a schematic view of the structure of a crystal which is a tetragonal, the structure having an A domain and a C' domain. The A domain has (100) in the direction perpendicular to its film thickness direction. That is, the domain has a [001] crystal axis in its film thickness direction. The C' domain has (100) in a direction slightly deviating from its film thickness direction. That is, the domain has a [001] crystal axis in a direction slightly deviating from its film in-plane direction. In addition, FIG. 5B is an example of the schematic film sectional structure of the piezoelectric film having the A domain and the C' domain shown in FIG. 5A. The A domain and the C' domain have a mirror image relation of a twin crystal by using (1bar01) as a twin crystal plane. Here, the C domain of FIG. 4A and the C' domain of FIG. 5A have different crystal orientations irrespective of the fact that each of them has a mirror image relation of a twin crystal with respect to the same A domain. The reason for the foregoing is as follows: the A domain is a tetragonal having the crystal axis in its film thickness direction, so four twin crystal planes of {110} present in the domain, that is, (101), (1bar01), (011), and (01bar1) are oriented toward directions different from one another. Accordingly, there are four domains each using {110} as a twin crystal plane with respect to the A domain, that is, the C domain, the C' domain, a C" domain, and a C'" domain. The term "C domain" as used herein is a generic term for, for example, the C domain, the C' domain, the C" domain, and the C'" domain as described above. At least two kinds of C domains may be mixed in the piezoelectric film 7 as shown in FIG. 6. In addition, the schematic film sectional structure of the piezoelectric film 7 shown in FIG. 6 includes a portion in which the C" domain and part of the A domain do not have any mirror image relation of a twin crystal, for example. However, at least the C" domain of FIG. 6 has a mirror image relation of a twin crystal with respect to the A domain by using (011) as a twin crystal plane. Accordingly, the A domain and the C domain are domains satisfying at least a mirror image relation of a twin crystal with respect to each other.

The twin crystal in the present invention has been described above with reference to the drawings. However, a twin crystal domain does not need to change only in the film in-plane direction as shown in FIG. 4B; for example, the domain may change in the film thickness direction or may be randomly present in the film. The same holds true for each of the A, B, C, and D domains. Here, the arrows of FIGS. 4A and 5A each indicate the direction of the [001] axis. In addition, FIGS. 4A, 4B, 5A, and 5B each show a crystalline structure having the A domain and the C domain, but a crystalline structure having the B domain and the D domain is also handled in the same manner.

(Method of Observing Twin Crystal)

Figure 7:
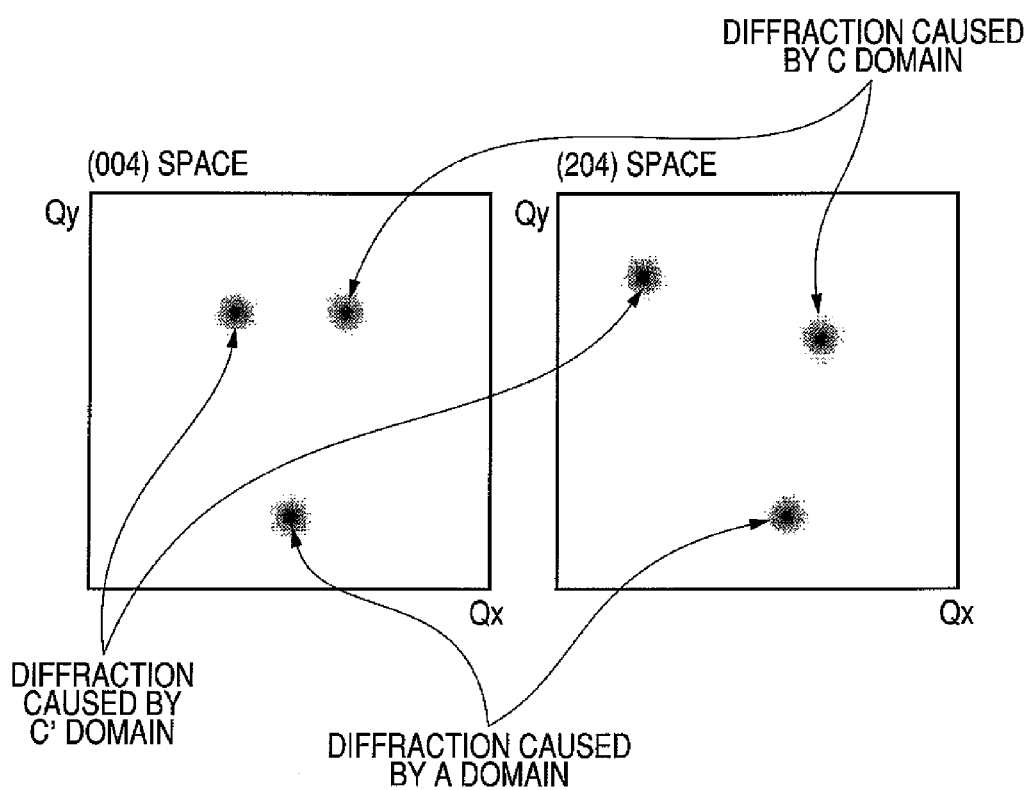
FIG. 7 is a schematic view of reciprocal mapping obtained as a result of the X-ray diffraction of the epitaxial oxide film of the present invention.
Figure 8:
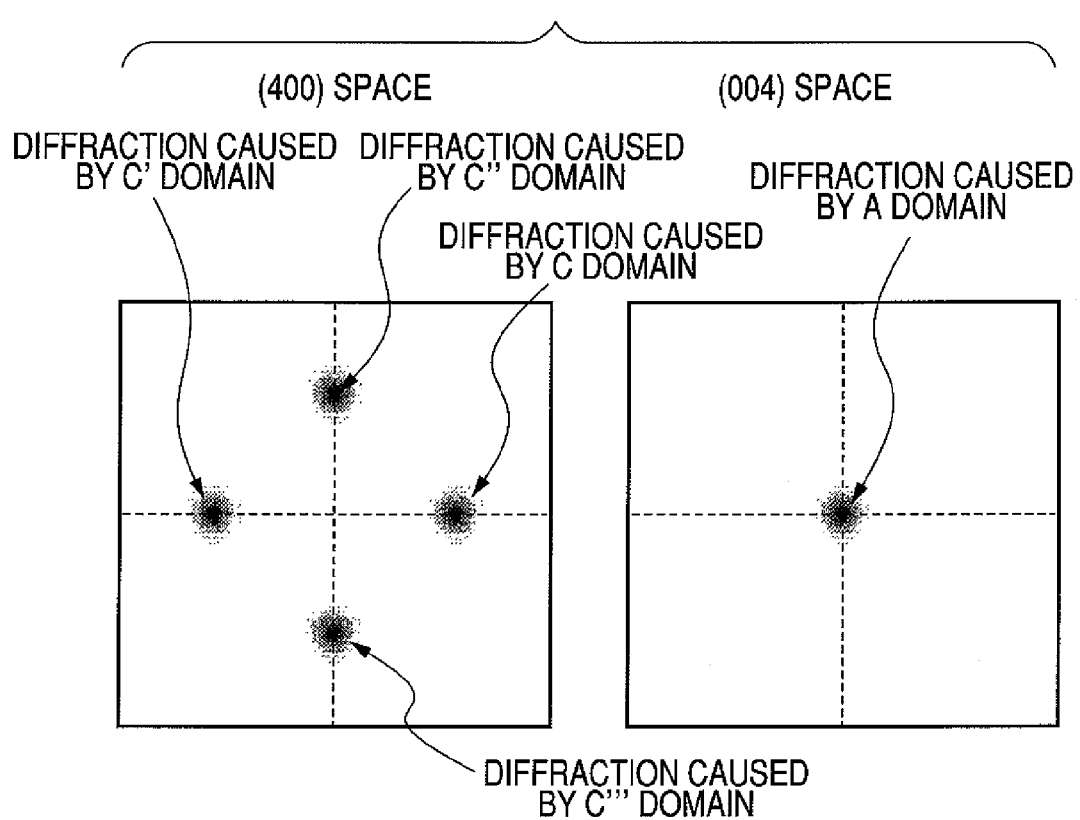
FIG. 8 is a schematic pole figure obtained as a result of the X-ray diffraction of the epitaxial oxide film of the present invention.

It should be noted that the twin crystal of a piezoelectric film can be easily identified by the reciprocal lattice space mapping and pole measurement of X-ray diffraction. For example, when a PZT piezoelectric film with a [001] orientation is a tetragonal and has a twin crystal shown in each of FIGS. 4A and 4B, the measurement of a {004} space and a {204} space by reciprocal lattice space mapping results in the appearance of diffraction as shown in FIG. 7. That is, as shown in FIG. 7, (402) diffraction caused by the C domain of the twin crystal appears near (204) diffraction caused by the A domain. At this time, the magnitude of a slight orientation deviation caused by the twin crystal (angular deviation from the origin of the reciprocal lattice space of each of the A domain and the C domain in the {004} space) is comparable to a value obtained by subtracting 90° from an angle twice as large as an angle establishing a tangential relationship between the a-axis length and the c-axis length of the crystal lattice of a tetragonal. In addition, when pole measurement is performed at an inclination of up to about 5° from the film thickness direction of the piezoelectric film ([004] direction of PZT) with a 2θ axis fixed at the diffraction angle of each of (004) and (400) in the same manner, diffraction points as shown in FIG. 8 are obtained.

A film in which the A domain and the C domain have at least a mirror image relation of a twin crystal and the twin crystal plane of the twin crystal is {110} has been described above as a representative example of the twin crystal of the present invention. A film in which the B domain and the D domain have at least a mirror image relation of a twin crystal and the twin crystal plane of the twin crystal is {110} is also handled in the same manner.

However, for example, when the A domain and the B domain, or the C domain and the D domain have a mirror image relation of a twin crystal, the present invention is not limited to the above-mentioned constitution. For example, films with a [001] orientation of a tetragonal having a {111} twin crystal plane are permitted, and, for example, a film in which such films are complicatedly coexistent is also permitted. Alternatively, for example, a mirror image relation of a twin crystal appearing as a result of the complicated coexistence of, for example, a film with a [100] orientation of a tetragonal having a {110} twin crystal plane or a film with a [001] orientation of a tetragonal having a {110} twin crystal plane is also permitted; provided, however, that each of the crystal orientation deviations between the A domain and the B domain and the crystal orientation deviation between the C domain and the D domain is preferably within 2° in this case.

(Orientation Deviation between B Domain and D Domain)

The piezoelectric film in the present invention has a rotational deviation in a film in-plane direction between a vector component in the film in-plane direction of the orientation of the A domain and a vector component in the film in-plane direction of the [001] orientation of the B domain. In the same manner, the piezoelectric film has a rotational deviation in the film in-plane direction between a vector component in the in-plane direction of the [001] orientation of the C domain and a vector component in the film in-plane direction of the [100] orientation of the D domain. For example, in the case of each of FIGS. 11 and 12, each of the rotational deviations is 45° in the in-plane direction.

Figure 12:
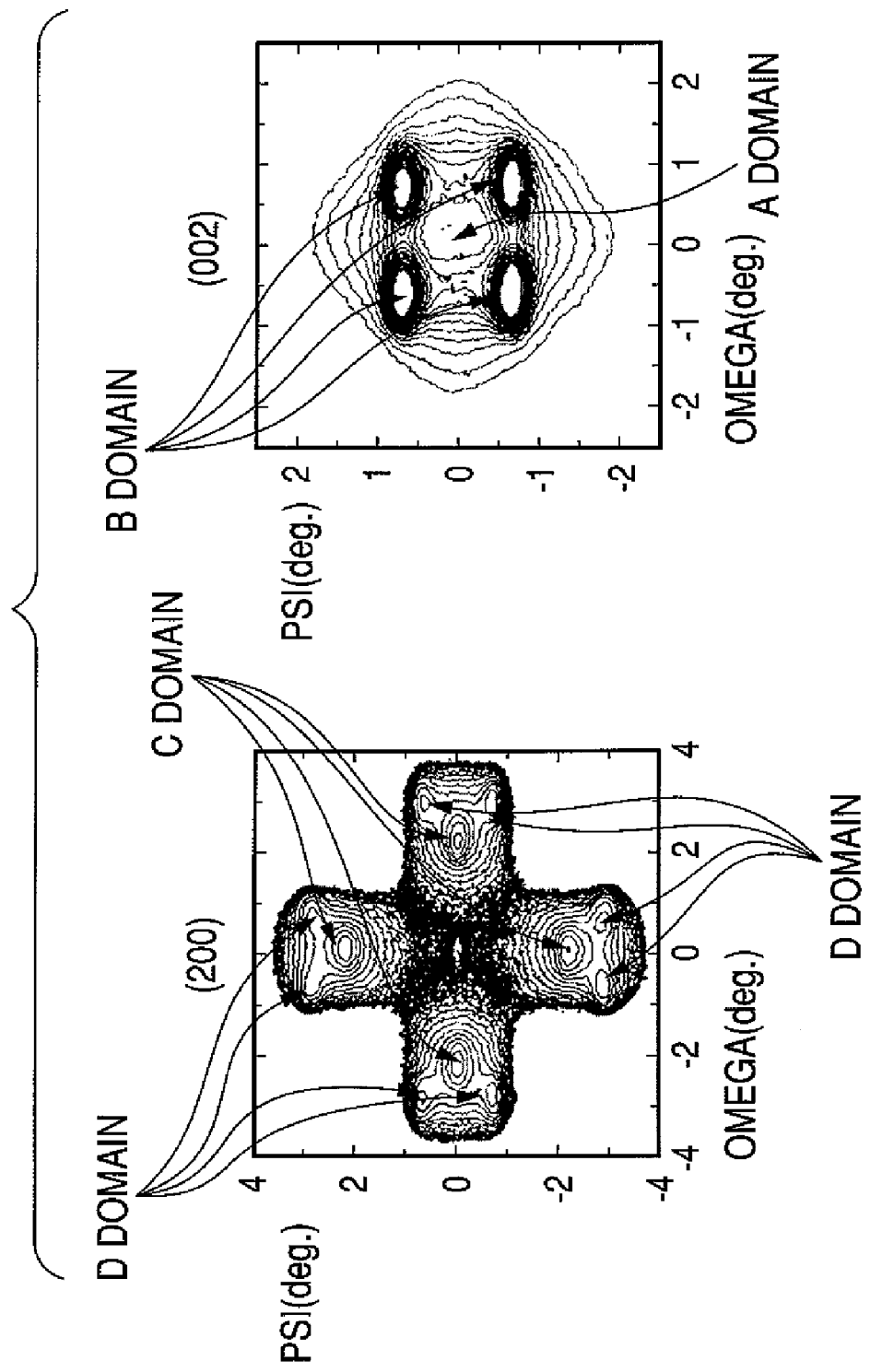
FIG. 12 is a view showing results of pole measurement by the X-ray diffraction of an epitaxial film having a PTO perovskite structure.
Figure 26:
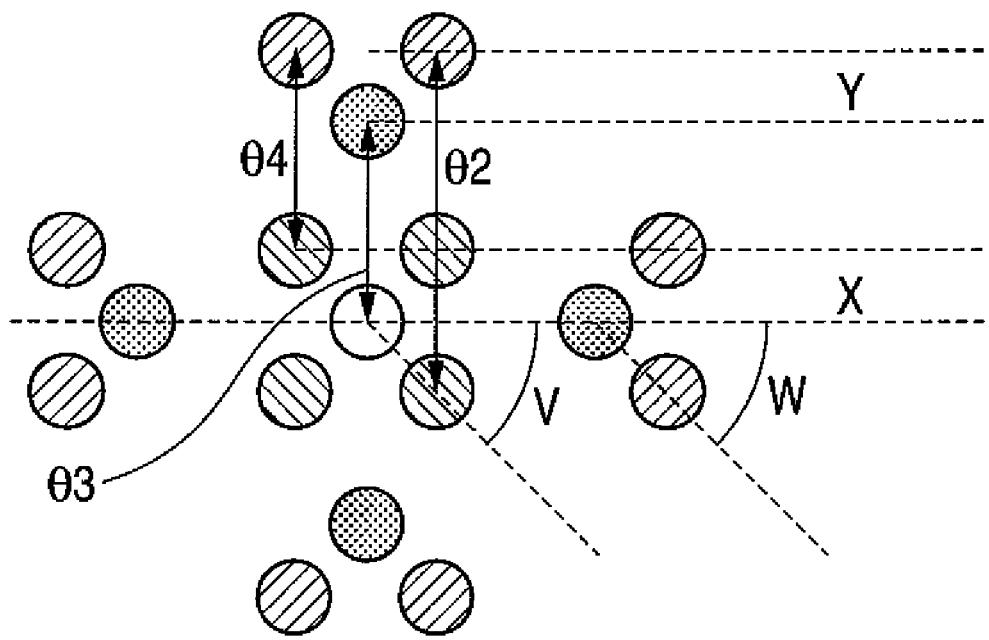
FIG. 26 is a schematic view of a superimposition of the pole figures of (200) and (002) of PTO.

FIG. 26 is a schematic view of the superimposition of the pole figures of PTO (200) and (002) shown in FIG. 12. Here, X represents the deviation of a [002] orientation between the A domain and the B domain, and Y represents the deviation of a [200] orientation between the C domain and the D domain. In addition, V represents a rotational deviation in a film in-plane direction between a vector component in the film in-plane direction of the [100] orientation of the A domain and a vector component in the film in-plane direction of the [001] orientation of the B domain. In addition, W represents a rotational deviation in the film in-plane direction between a vector component in the in-plane direction of the [001] orientation of the C domain and a vector component in the film in-plane direction of the [100] orientation of the D domain.

θ1=arctan(c/a)×2−90 represents a value obtained by subtracting 90° from an angle twice as large as an angle establishing a tangential relationship between the a-axis length and c-axis length of the crystal lattice of the piezoelectric film as a tetragonal. θ3 represents an orientation deviation between [002] of the A domain and [200] of the C domain. θ2 and θ4 each represent an orientation deviation between [002] of the B domain and [200] of the D domain. Although details on the fact that a complicated pole structure as shown in FIG. 26 appeared have not been understood yet in FIG. 12, the inventors of the present invention consider the reason for the foregoing to be, for example, as described below.

The A domain is a PTO film that has undergone epitaxial growth on an SRO film, and is defined as a domain having the same single crystal orientation in each of its film thickness direction and film in-plane direction as that of the SRO film as a base film. Next, the C domain is defined as a domain having a mirror image relation of a twin crystal with respect to the A domain by using {110} as a twin crystal plane. The C domain, which has the slight orientation deviation θ3 due to the mirror image relation of the twin crystal, should have the same single crystal orientation as that of the A domain and the SRO film. As described above, multiple C domains are present and observed. Here, θ1 determined from the a-axis length and c-axis length of the crystal lattice of the A domain should be equal to θ3. Next, the D domain is defined as a domain having a mirror image relation of a twin crystal with respect to the B domain by using {110} as a twin crystal plane. The D domain, which has the slight orientation deviation θ2 or θ4 due to the mirror image relation of the twin crystal with respect to the B domain, should have the same single crystal orientation as that of the A domain and the SRO film. As in the case of the C domain, multiple B domains and multiple D domains are present and observed.

Figure 27:
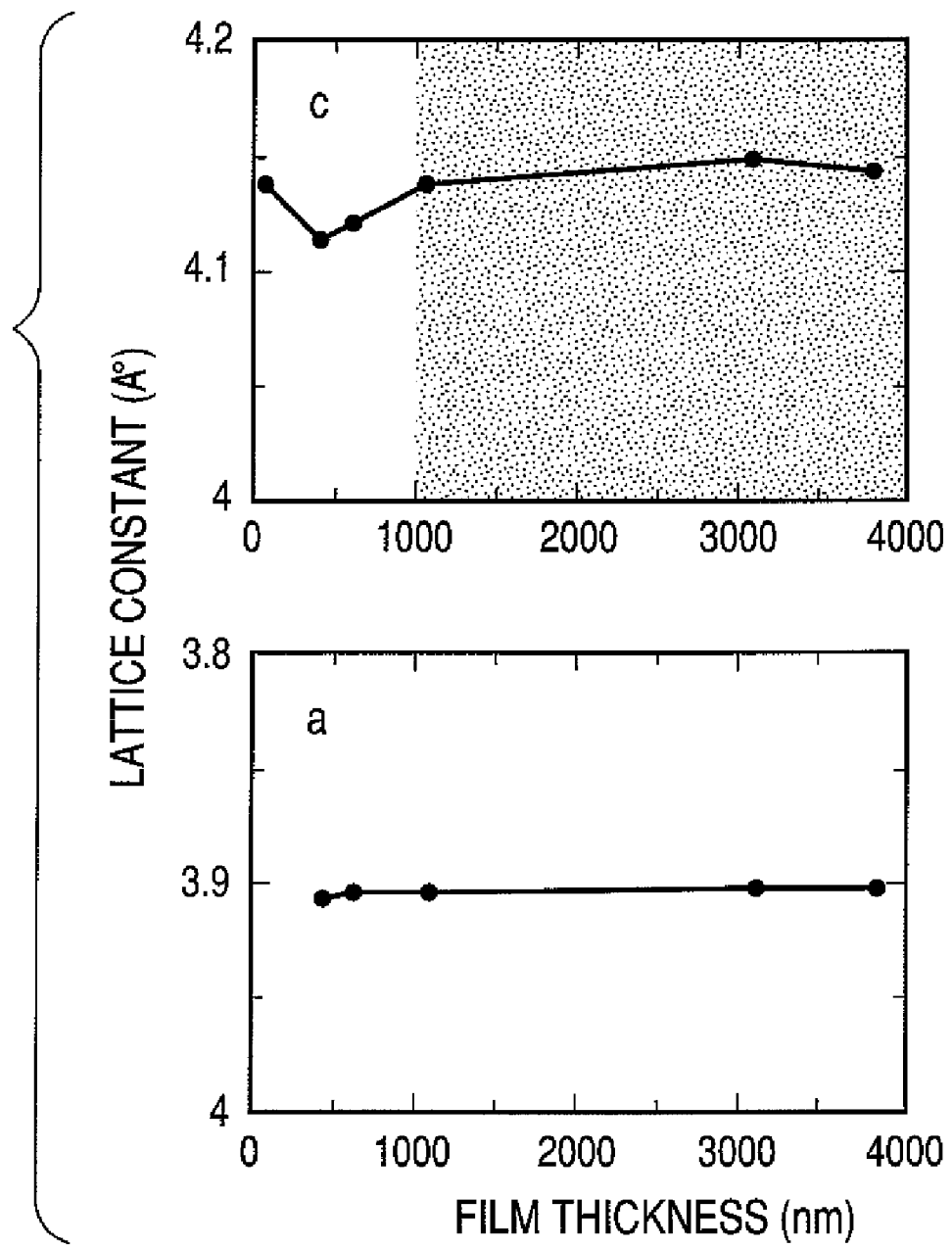
FIG. 27 is a view showing film thickness dependence of each of a-axis length and c-axis length of a crystal lattice of a PTO film.

Here, FIG. 27 shows the film thickness dependence of each of the a-axis length and c-axis length of the crystal lattice of the PTO film of FIG. 12. In the present invention, the B domain and D domain of FIG. 12 appear at a film thickness of 600 nm or more, so at a point of a film thickness of 600 nm or less of the crystal lattice of FIG. 27, the a-axis length was determined from the 2θ angle of the C domain in X-ray diffraction and the c-axis length was determined from the 2θ angle of the A domain in the X-ray diffraction. Meanwhile, at a point of a film thickness of 1,000 nm or more, the a-axis length was determined from the 2θ angle of the D domain in the X-ray diffraction and the c-axis length was determined from the 2θ angle of the B domain in the X-ray diffraction.

As can be seen from the figure, the c-axis length shows a local minimum at a film thickness of 500 nm or less. θ1 determined from the a-axis length and the c-axis length at a film thickness around 500 nm is substantially equal to θ3 and θ4. In addition, θ1 determined from the a-axis length and the c-axis length at a film thickness of 1,000 nm or more is substantially equal to θ2.

In other words, each of the combination of the A domain and the C domain and the combination of the B domain and the D domain has a mirror image relation of a twin crystal by using {110} as a twin crystal plane. However, the slight orientation deviation between the A domain and the C domain and the slight orientation deviation between the B domain and the D domain seem to differ from each other due to the film thickness dependence of the piezoelectric film.

Figure 28:
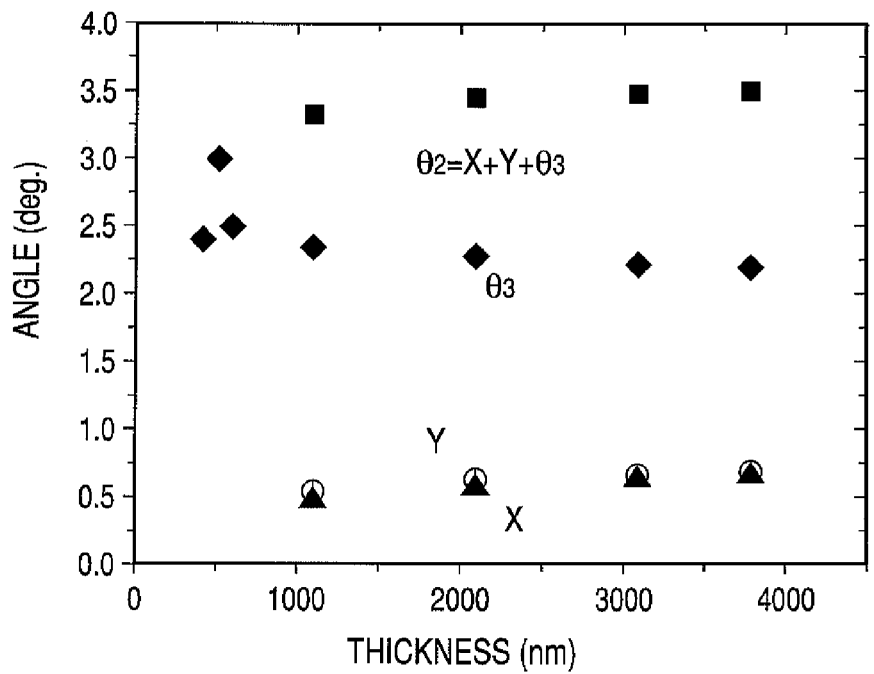
FIG. 28 is a view showing a relationship between a deviation angle of each of A, B, C, and D domains of a piezoelectric film (PTO film) of the present invention and the film thickness of the piezoelectric film.

Here, FIG. 28 shows a relationship between the deviation angle of each of the A, B, C, and D domains of the piezoelectric film (PTO film) of the present invention and the film thickness of the piezoelectric film. It is found that θ2, and X and Y do not exist at a film thickness of 500 nm or less because the B domain and the D domain which are observed at a film thickness of 1,000 nm are not present at a film thickness of 500 nm or less, but θ2, and X and Y satisfy the relationship of θ2=X+Y+θ3 at a film thickness of 1,000 nm or more. The value for θ2 substantially coincides with θ1 determined from the a-axis length and c-axis length of a PTO bulk body. In other words, it is found that the B domain and the D domain each have a lattice constant substantially equal to that of the bulk body. Meanwhile, at a film thickness of 500 nm or less, θ1 substantially coincides with θ3 as shown in FIG. 27, so it is found that the domains each have a lattice constant distorted with respect to the bulk body. The reason for the foregoing can be considered on the basis of a structural model as described below.

Figure 29:
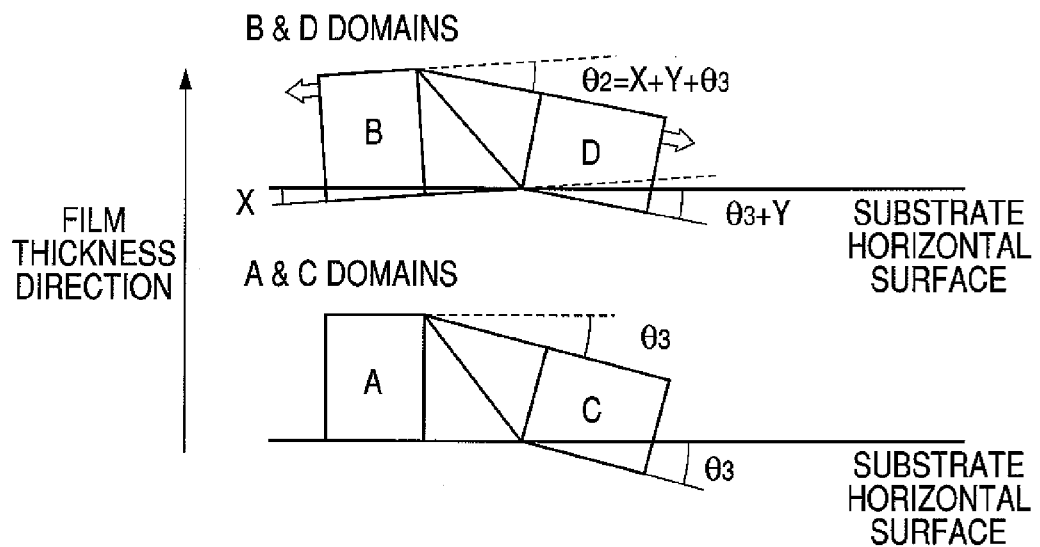
FIG. 29 is a schematic view taking a relationship among a domain structure of the piezoelectric film of the present invention seen from a film sectional direction, each of the A, B, C, and D domains, and the deviation angle of each of the domains into consideration.

FIG. 29 is a schematic view taking into consideration a relationship among the domain structure of the piezoelectric film of the present invention seen from a film sectional direction on the assumption that the film satisfies the following conditions, each of the A, B, C, and D domains, and the deviation angle of each of the domains.

(1) The piezoelectric film has the A, B, C, and D domains, each of the A domain and the B domain has a [001] orientation, and each of the C domain and the D domain has a [100] orientation.

(2) The A domain and the C domain have at least a mirror image relation of a twin crystal.

(3) The twin crystal plane of the twin crystal is {110}.

(4) The B domain and the D domain have at least a mirror image relation of a twin crystal.

(5) The twin crystal plane of the twin crystal is {110}.

At a thin film portion having a film thickness of 600 nm or less from the substrate, the A domain and the C domain are present with a deviation of θ3 due to the above-mentioned mirror image relation of the twin crystal. Further, at a thick film portion having a film thickness of 600 nm or more from the substrate, the B domain and the D domain are present with a deviation of θ2 due to the above-mentioned mirror image relation of the. Here, the C domain has a deviation of θ3 with respect to a substrate horizontal surface. On the other hand, the D domain has a deviation of θ3+Y with respect to the substrate horizontal surface. Such difference in deviation occurs probably because of the following reason: the A domain and the C domain are present at the thin film portion having a film thickness of 600 nm or less from the substrate, so it is difficult to remove a lattice deviation corresponding to Y due to a constraint from the substrate. In other words, a deviation angle of θ1 caused by the fact that the A domain and the C domain have the mirror image relation of the twin crystal reduces due to the distortion of a lattice, and the constraint from the substrate is probably absorbed. On the other hand, the B domain and the D domain are present at the thick film portion having a film thickness of 600 nm or more, so each of them can have a lattice constant substantially equal to that of a bulk without receiving any constraint from the substrate. As a result, the deviation angle of θ1 caused by the fact that the A domain and the C domain have the mirror image relation of the twin crystal is equal to an angle of θ2 obtained by adding X and Y to θ3. That is, the B domain and the D domain can probably be present at the thick film portion having a film thickness of 600 nm or more because the B domain has a uniform deviation corresponding to an angle of X with respect to the A domain and the D domain has a uniform deviation corresponding to an angle of Y with respect to the C domain. In addition, the relationship of X=Y can also be expected from the results of FIG. 28 and the foregoing discussion.

The crystal orientation deviation between the A domain and B domain of the piezoelectric film of the present invention is less than 2°, and the crystal orientation deviation between the C domain and D domain of the piezoelectric film is less than 2° probably because of the following reason. A ratio of the c-axis length of the tetragonal of a perovskite composite oxide represented by the general formula $ABO_3$, in particular, a lead-based perovskite composite oxide to the a-axis length of the tetragonal is generally small. A known material having a relatively large ratio of a c-axis length to an a-axis length is PTO; PTO has a ratio c/a of the c-axis length of a tetragonal to the a-axis length of the tetragonal of about 1.06. $\theta 1$ described above determined from the value is about 3.5°. Incidentally, the crystal orientation deviation angle between the A domain and the B domain is X. On the basis of FIG. 28, $\theta 2$ equals to the sum of X, Y, and $\theta 3$, the relationship of X=Y is substantially established, and $\theta 2$ is about 3.5°. As a result, in the case of, in particular, a lead-based perovskite composite oxide, the crystal orientation deviation between the A domain and B domain of the piezoelectric film of the present invention can be expected to be less than 2°, and the crystal orientation deviation between the C domain and D domain of the piezoelectric film can be expected to be less than 2°.

On the other hand, when even a non-lead-based piezoelectric material is taken into consideration, for example, $BiCoO_3$ (bismuth cobalt oxide) has a ratio c/a of the c-axis length of a tetragonal to the a-axis length of the tetragonal as large as about 1.25. As a result, a value for $\theta 2$ is expected to exceed 10°. Accordingly, depending on a material, the crystal orientation deviation between the A domain and B domain of the piezoelectric film of the present invention may be less than 5°, and the crystal orientation deviation between the C domain and D domain of the piezoelectric film may be less than 5°.

Figure 30:
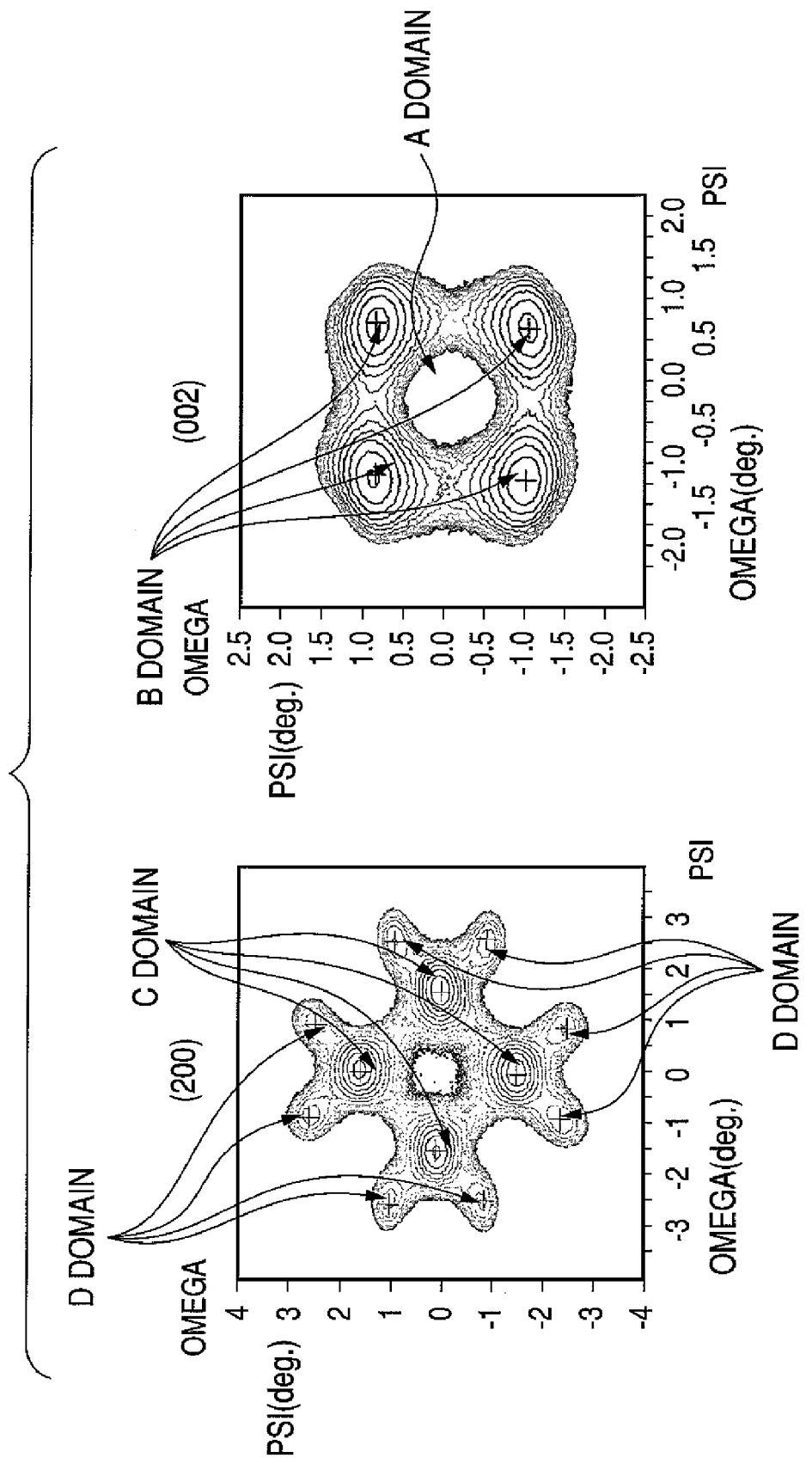
FIG. 30 is a view showing results of the pole measurement of (002) and (200) of PTO in a case where each of Si and KTO is used in a substrate.

As described above, the complicated domain structure of the piezoelectric film of the present invention is probably formed under the influences of: the twin crystal structure composed of the A domain and the C domain; the twin crystal structure composed of the B domain and the D domain; and a stress from the substrate. Accordingly, the use of a substrate having physical properties such as a coefficient of thermal expansion and hardness different from those of the original substrate in the piezoelectric film shows a slight change in, for example, deviation angle of the film. For example, FIGS. 30 and 31 each show the results of the pole measurement of (002) and (200) of PTO in the case where Si or KTO is used in the substrate. The following can be understood from those results as well as the results of the pole measurement of (002) and (200) of PTO in the case where STO is used in the substrate of FIG. 12.

That is, the magnitude of $\theta 3$ varies from substrate to substrate, but the magnitude of $\theta 2$ in a substrate is substantially equal to the magnitude of $\theta 2$ in another substrate, and $\theta 2$ is about 3.5° which substantially coincides with $\theta 1$ of a bulk body. As described above, the manner in which a stress is applied to a film varies from substrate to substrate, so $\theta 3$ obtained from the twin crystal structure composed of the A domain and the C domain varies from substrate to substrate, but $\theta 2$ obtained from the twin crystal structure composed of the B domain and the D domain is independent from a substrate.

Figure 32:
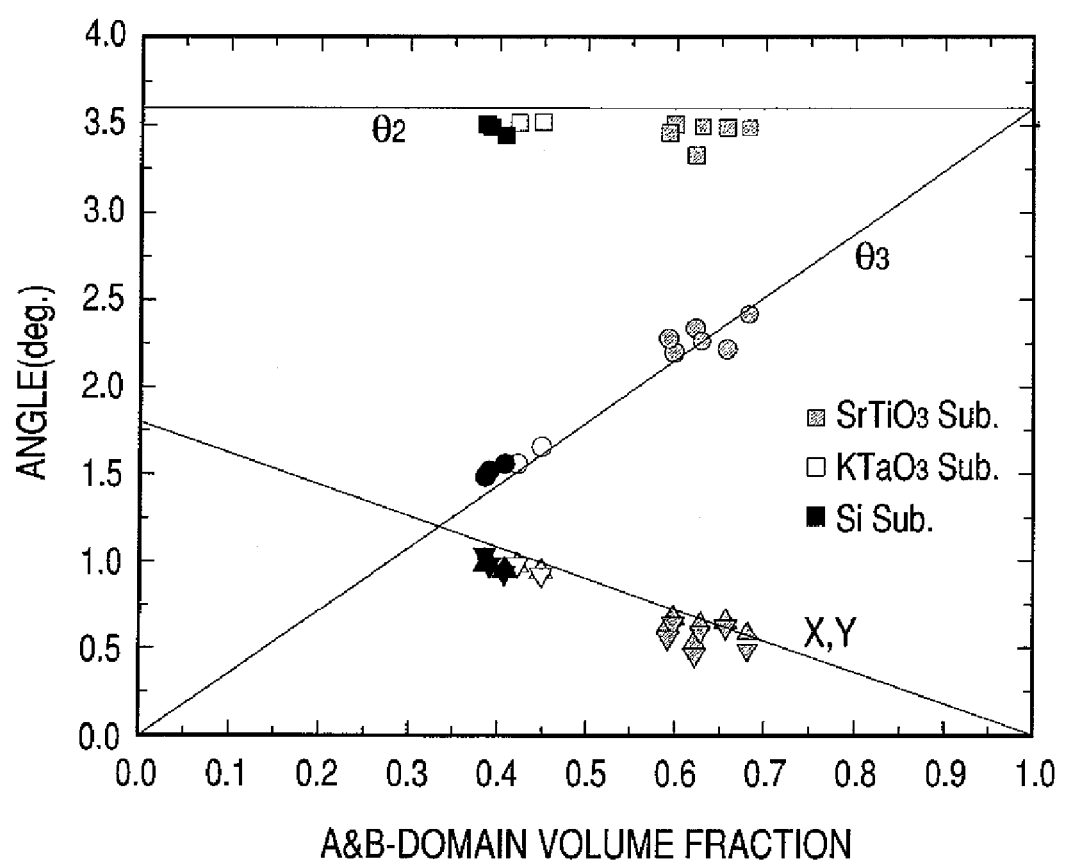
FIG. 32 is a graph showing a relationship between the deviation angle of each of the A, B, C, and D domains of the PTO film and a ratio of the A and B domains to an entirety of the A, B, C, and D domains.

FIG. 32 shows the results that support the foregoing. FIG. 32 shows a relationship between the deviation angle of each of the A, B, C, and D domains of the PTO film and a ratio of the A and B domains to the entirety of the A, B, C, and D domains. Here, the domain ratio was derived from the diffraction intensity of each domain in X-ray diffraction. As can be seen from FIG. 32, as the ratio of the A and B domains to the entirety of the A, B, C, and D domains increases, $\theta 3$ increases, and each of X and Y reduces. In addition, as the ratio of the A and B domains to the entirety of the A, B, C, and D domains approaches 1, $\theta 3$ approaches the value for each of $\theta 2$ and $\theta 1$. In contrast, as the ratio of the A and B domains to the entirety of the A, B, C, and D domains approaches 0, each of X and Y approaches 0. In other words, the magnitude of each of X, Y, and $\theta 3$ can be determined by a linear function of the ratio of the A and B domains to the entirety of the A, B, C, and D domains.

In other words, when the ratio of the A and B domains to the entirety of the A, B, C, and D domains is represented by Vc, the magnitude of each of X and Y satisfies the relationship of $X=Y=\theta 1 \times (1-Vc)/2$.

Further, the ratio of the A and B domains to the entirety of the A, B, C, and D domains is determined by a coefficient of thermal expansion $\alpha$sub of the substrate, a coefficient of thermal expansion $\alpha$film of the epitaxial oxide film, a film formation temperature Ts, and a Curie temperature Tc of the epitaxial oxide film. For $\sigma=(Ts-Tc) \times (\alpha film - \alpha sub)$, it has been already confirmed that Vc is represented as a linear function of $\sigma$. On the basis of the foregoing, it can be found that Vc can be controlled by a thermal stress received by the epitaxial oxide film, and the deviation angle or the like of each of the A, B, C, and D domains can be controlled.

V and W will be finally discussed. Suppose that the A, B, C, and D domains can be coexistent in the piezoelectric film while having film thickness dependence on the basis of the above-mentioned relationships. As described above, the C domain, the C' domain, the C" domain, and the C''' domain can be present, so the D domain must be present while achieving compatibility between $\theta 2$ and $\theta 4$ with respect to the B domain. In this case, a vector component in a film in-plane direction of the [100] orientation of the A domain and a vector component in the film in-plane direction of the [001] orientation of the B domain must have a rotational deviation in the film in-plane direction. In the same manner, a vector component in the in-plane direction of the [001] orientation of the C domain and a vector component in the film in-plane direction of the [100] orientation of the D domain must have a rotational deviation in the film in-plane direction. The foregoing is probably the mechanism by which the complicated crystalline structure obtained in FIG. 11 or 12 can be obtained. In addition, in the case of FIG. 11 or 12, the above-mentioned rotational deviation must be 45°. In other words, W and V preferably satisfy the relationship of $0<V=W\leq 45$, or more preferably satisfy the relationship of V=W=45. Further, it can also be found that the relationship of $(\theta 2-\theta 4)/2=X=Y$ is established.

(90° Domain Structure)

Further, the piezoelectric film of the present invention preferably has a 90° domain structure. The term "90° domain structure" as used herein refers to a structure in which a domain having (100) in the direction perpendicular to its film thickness direction, that is, having a [001] crystal axis in its film thickness direction and a domain having (001) in the direction perpendicular to its film thickness direction, that is, having a [100] crystal axis in its film thickness direction are coexistent. In this case, the above-mentioned two domains do not have a mirror image relation of a twin crystal, so they are not twin crystal domains. When the piezoelectric film has the 90° domain structure, the domains having a crystal orientation deviation with respect to each other and domain having a twin crystal structure of the present invention can be present in each of the domain having the [001] crystal axis in its film thickness direction and the domain having the [100] crystal axis in its film thickness direction. As a result, a piezoelectric film having an additionally complicated structure can be obtained.

(Material of which Epitaxial Oxide Film is Constituted)

The epitaxial oxide film as a piezoelectric film is preferably mainly composed of lead titanate or lead zirconate titanate. This is because, in a perovskite composite oxide constituted according to the general formula $ABO_3$, a ferroelectric material such as PTO or PZT generally has the lattice distortion of a tetragonal or a rhombohedral larger than that of a relaxor state of electrostrictive material such as PZN-PT (here, the term "lattice distortion" refers to a ratio c/a of the c-axis length of a crystal lattice to the a-axis length of the crystal lattice in the case of a tetragonal, and the deviation of an angle α formed by a, b, and c axes from 90° in the case of a rhombohedral). As a result, a large piezoelectric change can be easily generated, and the alleviation of an internal stress generated upon production of a piezoelectric film element is facilitated. For example, PTO has a ratio c/a of the c-axis length of a tetragonal to the a-axis length of the tetragonal of about 1.06. PZT near a crystalline phase boundary called MPB has a ratio c/a of the c-axis length of a tetragonal to the a-axis length of the tetragonal of about 1.03. $BaTiO_3$ (barium titanate) has a ratio c/a of the c-axis length of a tetragonal to the a-axis length of the tetragonal of about 1.01. Further, for example, $BiCoO_3$ (bismuth cobalt oxide) serves as an extremely excellent piezoelectric film because it has a ratio c/a of the c-axis length of a tetragonal to the a-axis length of the tetragonal as large as about 1.25.

(Film Thickness)

The film thickness of the piezoelectric film is preferably 0.6 μm or more. When the film thickness is 0.6 μm or more, the complicated twin crystal structure of the present invention can be obtained with improved ease. In the case of, in particular, a film thickness of 60 nm or less, it becomes difficult to obtain the B domain and the D domain described above of which the complicated twin crystal structure of the present invention is formed, though the difficulty depends on the kinds of a material and a substrate.

(Measurement Method)

As described above, the crystalline structure of the piezoelectric film can be easily observed by X-ray diffraction. The structure can be similarly observed by, for example, cross-section observation with a transmission electron microscope (TEM) in addition to the above-mentioned X-ray diffraction.

(Method of Forming Epitaxial Oxide Film)

A method of forming the epitaxial oxide film that can be used as the piezoelectric film in the present invention is not particularly limited. A thin film formation method such as a sol-gel method, a hydrothermal synthesis method, a gas deposition method, or an electrophoresis method can be employed in ordinary cases for a thin film having a film thickness of 10 μm or less. Further, a thin film formation method such as a sputtering method, a chemical vapor deposition method (CVD method), a metal organic chemical vapor deposition method (MOCVD method), an ion beam deposition method, a molecular beam epitaxial method, or a laser ablation method can also be employed. Each of those thin film formation methods allows the formation of a piezoelectric film from a substrate or from a lower electrode by means of epitaxial growth.

Figure 9:
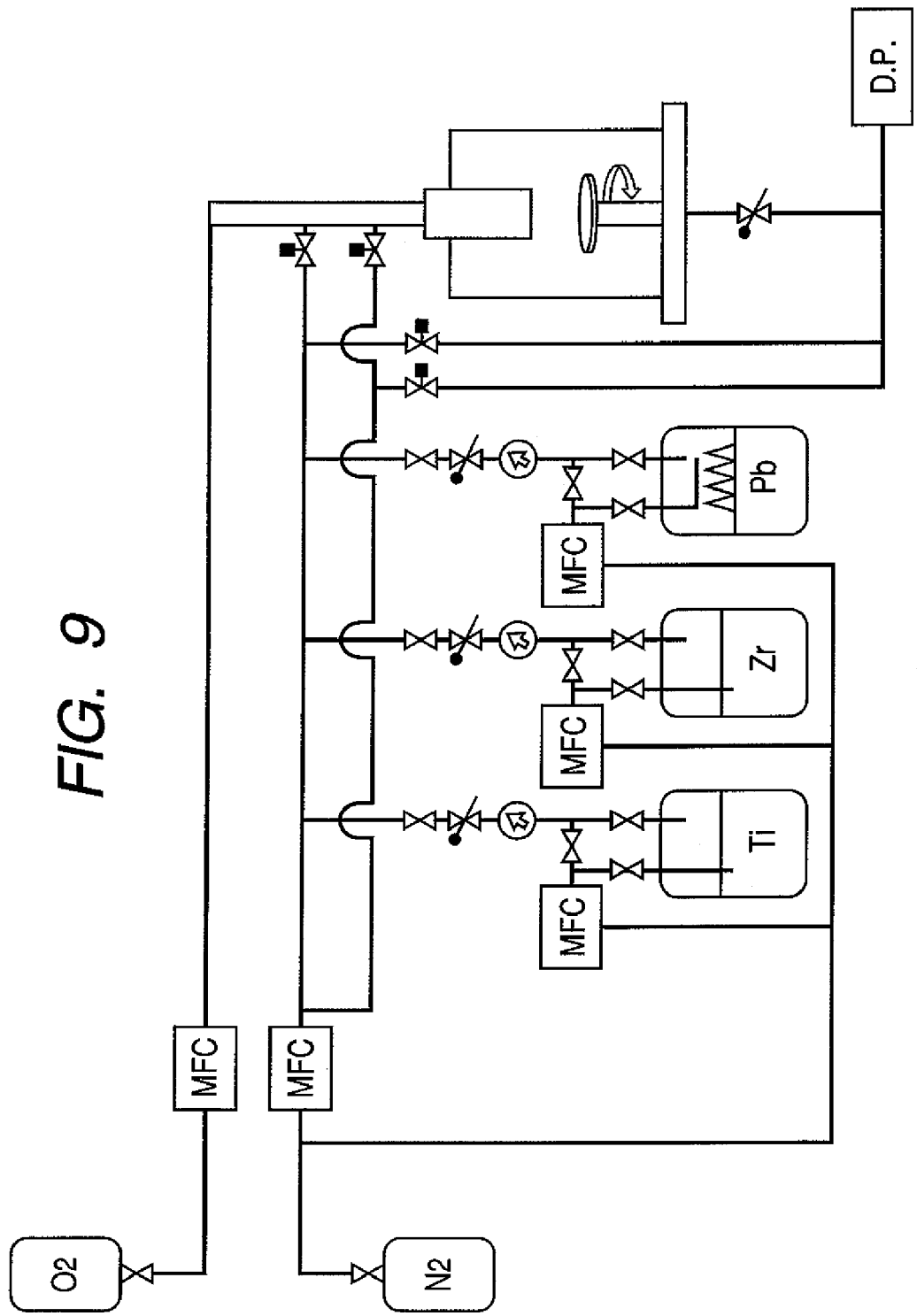
FIG. 9 is a view showing an example of a constitution of a apparatus for producing an epitaxial oxide film.

Of the above-mentioned various methods, a pulse MOCVD method using a device shown in FIG. 9 is a particularly preferable method as the thin film formation method of forming a film.

In the pulse MOCVD method, the temperature of a starting material supply path is preferably controlled in such a manner that an oxidation reaction that inhibits the formation of a single crystal into a film does not progress in piping. Further, in the pulse MOCVD method, a mixed gas of an inert carrier gas and a starting material is preferably supplied in an intermittent manner. In this case, the control of the time period for which the mixed gas is supplied in an intermittent manner provides the mixed gas with a sufficient reaction time on a substrate, whereby damage or the like to a film can be suppressed. As a result, defects and the like caused by oxygen deficiency and lead deficiency in a piezoelectric film, a lattice site defect of each constituent of which a crystal lattice in the film is constituted, and other causes can be suppressed. A production method having a high film formation rate is preferably employed as a method with which the crystalline structure of the present invention can be obtained with particular ease. To this end, it is preferable that: the amount of a raw material gas to be supplied be increased; and an oxygen partial pressure be increased so that an oxide film free of any defect can be obtained.

Examples of a raw material that can be used in the MOCVD method include an alkyl metal compound, an alkoxyl metal compound, a β-diketone compound, a cyclopentadienyl compound, a halogen compound, and an organic acid compound.

When PZT is formed into a piezoelectric film, any one of the following materials is preferably used as a raw material {a(($CH_3$)$_3CCO_2$)$_2$CH group is represented by thd}.

First, examples of the Pb material can include Pb($C_2H_5$)$_4$, Pb(thd)$_2$, Pb(thd)(OC$_2H_5$)$_2$, ($C_2H_5$)$_3$PbOCH$_2$C(CH$_3$)$_3$, Pb($C_2H_5$)$_3$(OC$_4H_9$-t), Pb($C_6H_5$)$_4$, and $PbCl_2$. Examples of the Zr material can include Zr(OC$_4H_9$-t)$_4$, Zr(i-C$_3H_7$)$_4$, Zr(OC$_2H_5$)$_4$, Zr(OCH$_3$)$_4$, and Zr(OC$_5H_{11}$-n)$_4$. Examples of the Ti material can include Ti(OC$_3H_7$-i)$_4$, Ti(thd)$_2$(OC$_3H_7$-i)$_2$, Ti(OC$_2H_5$)$_4$, $TiCl_4$, Ti(OCH$_3$)$_4$, and Ti(OC$_5H_{11}$)$_4$. Further, part of Pb in the PZT may be substituted by La or the like. Examples of the substituted material include La(thd)$_3$, La(C$_2H_3$θ2)$_4$, and $LaCl_3$. Pb in the PZT composition may be in an excess amount as compared to that of a B site element such as Zr or Ti.

The carrier gas is selected from inert gases, and Ar, $N_2$, He, or the like is preferable. A mixed system of those gases is also permitted. The flow rate of the carrier gas is preferably in the range of 10 cm$^3$/min to 1,000 cm$^3$/min.

(Structure of Piezoelectric Film Element)

The piezoelectric film element of the present invention has the piezoelectric film of the present invention and a pair of electrodes in contact with the piezoelectric substance. A first electrode (electrode film) or a second electrode (electrode film) of the piezoelectric film element of the present invention is preferably made of a material having good adhesiveness with the above-mentioned piezoelectric film and having high conductivity. That is, the first or second electrode is preferably made of a material capable of setting the specific resistance of an upper electrode film or a lower electrode film to $10^{-7}$ to $10^{-2}$ Ω·cm. Such material is generally a metal in many cases; for example, Au, Ag, or Cu, or a metal belonging to a Pt group such as Ru, Rh, Pd, Os, Ir, or Pt is preferably used as an electrode material. An alloy material such as a silver paste or solder containing any one of the above materials can also be preferably used because of its high conductivity. In addition, a conductive oxide material such as IrO (iridium oxide), SRO (strontium ruthenate), ITO (conductive tin oxide), or BPO (barium plumbate) is also a preferable electrode material. In addition, an electrode film may be of a single-layer constitution, or may be of a multi-layer constitution. For example, a constitution such as Pt/Ti may be adopted for improving adhesiveness with a substrate. Alternatively, a constitution such as SRO/LNO (lanthanum nickel oxide) may be adopted for causing epitaxial growth from the substrate or a buffer layer.

It should be noted that at least the first electrode is preferably a single crystal body or an epitaxial film because the piezoelectric film of the present invention is composed of an epitaxial oxide film. The piezoelectric film of the present invention has a lattice constant of about 4 Å because it is composed of a perovskite composite oxide constituted according to the general formula $ABO_3$. In view of the foregoing, a material capable of securing a lattice constant of about 4 Å is a preferable electrode material. Of the above-mentioned materials, for example, a metal belonging to the Pt group, SRO, BPO, or the like is particularly preferable. Further, when the first electrode film contains at least an oxide electrode film having a perovskite structure with a <100> orientation, a uniaxially oriented film or single crystal film with a <100> orientation can be easily produced. In particular, SRO has a lattice constant of about 4 Å, which is close to the lattice constant of PZT, and a film of SRO can be easily turned into a single crystal, so an epitaxial piezoelectric film can be produced with improved ease.

In addition, the film thickness of an electrode film is preferably about 100 nm to 1,000 nm, or more preferably 500 nm or less. The film thickness of the electrode film is preferably 100 nm or more because the resistance of the electrode film becomes sufficiently small. The thickness of the electrode film is preferably 1,000 nm or less because the possibility that the piezoelectricity of the piezoelectric film element is impaired can be eliminated.

A method of forming an electrode film is not particularly limited. An electrode film having a film thickness of 1,000 nm or less can be formed by employing a thin film formation method such as a sol-gel method, a hydrothermal synthesis method, a gas deposition method, or an electrophoresis method in ordinary cases. Further, the electrode film can be formed by employing a thin film formation method such as a sputtering method, a CVD method, an MOCVD method, an ion beam deposition method, a molecular beam epitaxial method, or a laser ablation method. Each of those thin film formation methods facilitates the formation of an epitaxial piezoelectric film because each of them allows the formation of a piezoelectric film from a substrate or a buffer layer by means of epitaxial growth.

(Liquid Discharge Head and Liquid Discharge Apparatus)

Next, a liquid discharge head of the present invention will be described.

The liquid discharge head of the present invention has: a discharge port; a separate liquid chamber in communication with the discharge port; a vibration plate constituting a part of the separate liquid chamber; and a piexoelectric substrate element which is provided outside the separate liquid chamber and which is used for applying vibration to the vibration plate. In the liquid discharge head, a liquid in the separate liquid chamber is discharged from the discharge port due to a volume change in the separate liquid chamber caused by the vibration plate. Then, the liquid discharge head is characterized by employing a piezoelectric film element using the epitaxial oxide film with the above constitution as the piezoelectric substrate element.

The use of the piezoelectric film element having the epitaxial oxide film with the above constitution according to the present invention can easily result in a liquid discharge head capable of: showing high uniform discharge performance; and reducing the size of a discharge pressure-generating element structure pattern including the piezoelectric film element. The liquid discharge head of the present invention may be used in an image forming device such as an ink jet printer, a facsimile, a multifunction machine, or a copying machine, or in an industrial discharge apparatus for discharging a liquid except ink.

Figure 13:
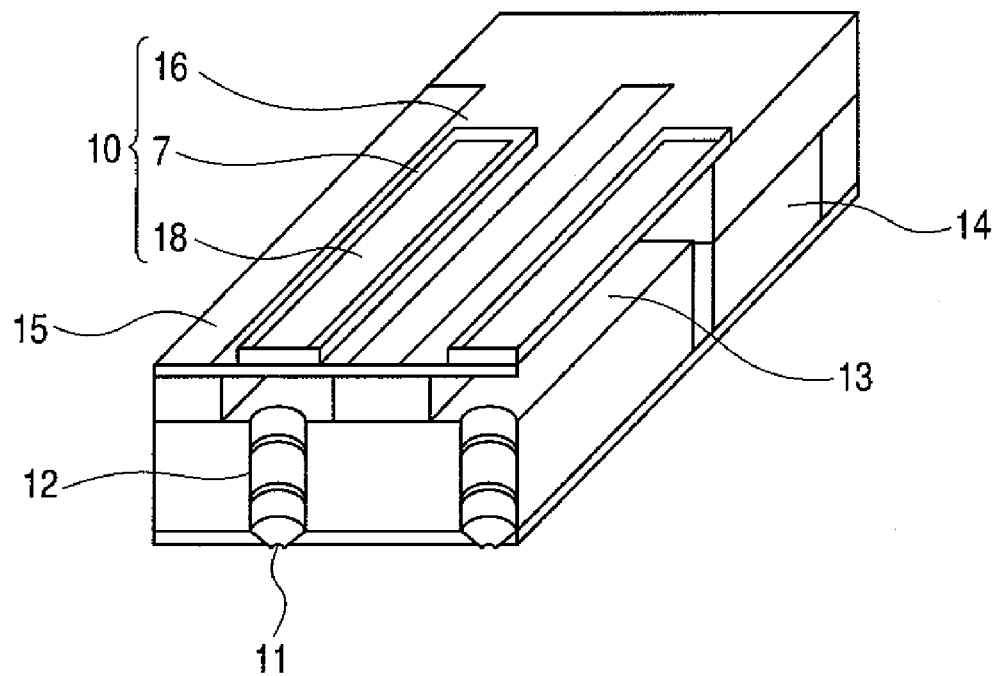
FIG. 13 is a schematic perspective view of a part of a constitution of a liquid discharge head.

The liquid discharge head of the present invention will be described with reference to FIG. 13. FIG. 13 is a schematic view showing an example of an embodiment of the liquid discharge head of the present invention. The liquid discharge head of the embodiment shown in FIG. 13 includes: discharge ports 11; a communication hole 12 for establishing communication between each of the discharge ports 11 and the corresponding separate liquid chamber 13; and a common liquid chamber 14 for supplying a liquid to each of the separate liquid chambers 13. A liquid is supplied to each of the discharge ports 11 along a path in which the discharge port, the corresponding separate liquid chamber, and the common liquid chamber are in communication with one another. Part of each of the separate liquid chambers 13 is constituted of a vibration plate 15. The piezoelectric film elements 10 for applying vibration to the vibration plate 15 are provided outside the separate liquid chambers 13. Once the piezoelectric film elements 10 are driven, vibration is applied by the piezoelectric film elements 10 to the vibration plate 15, thereby causing a volume change in each of the separate liquid chambers 13. As a result, a liquid in each of the separate liquid chambers 13 is discharged from its discharge port. Each of the piezoelectric film elements 10, which is of a rectangular shape in an embodiment shown in FIG. 14 to be described below, may be of a shape such as an ellipse, a circle, or a parallelogram.

Figure 14:
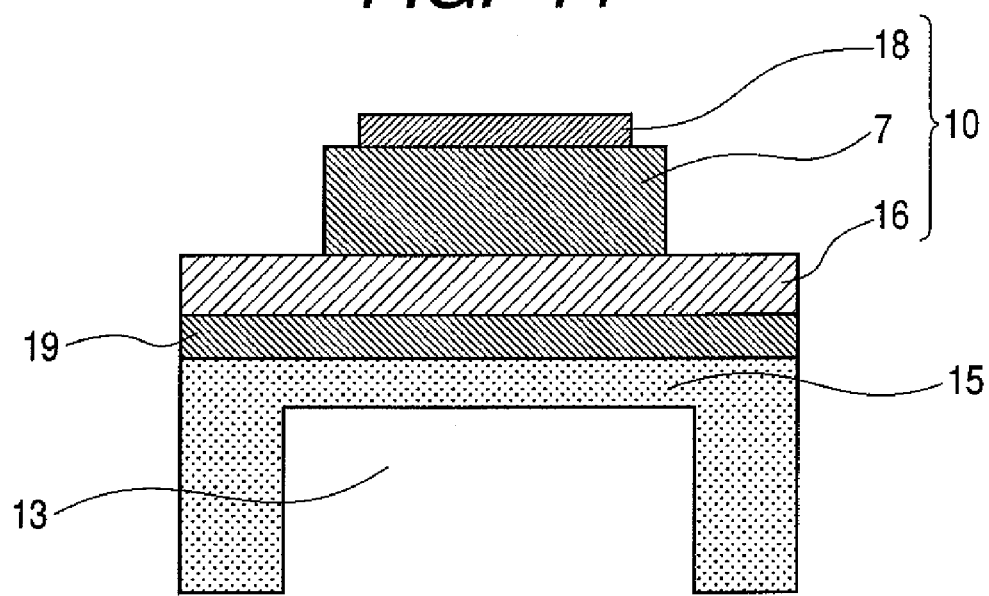
FIG. 14 is a schematic sectional view in a width direction of the liquid discharge head shown in FIG. 13.

FIG. 14 shows a schematic sectional view in the width direction of the liquid discharge head shown in FIG. 13. The piezoelectric film elements 10 of which the liquid discharge head of the present invention is constituted will be described in more detail with reference to FIG. 14. The shown sectional shape of the piezoelectric film element 10 is a rectangle, but the sectional shape may be a trapezoid or an inverted trapezoid. In addition, in FIG. 14, the first electrode film 6 corresponds to a lower electrode film 16 and the second electrode film 8 corresponds to an upper electrode film 18. Each of the first electrode film 6 and the second electrode film 8 of which the piezoelectric film element 10 of the present invention is constituted may be either the lower electrode film 16 or the upper electrode film 18. The reason for the foregoing is due to a production method upon turning of the piezoelectric film element into a device, and an effect of the present invention can be obtained irrespective of whether which one of the electrode films is the lower electrode film 16. In addition, the vibration plate 15 may be formed of the substrate 5 of which the piezoelectric film element 10 of the present invention is constituted. In addition, a buffer layer 19 may be present between the vibration plate 15 and the lower electrode film 16.

Figure 15:
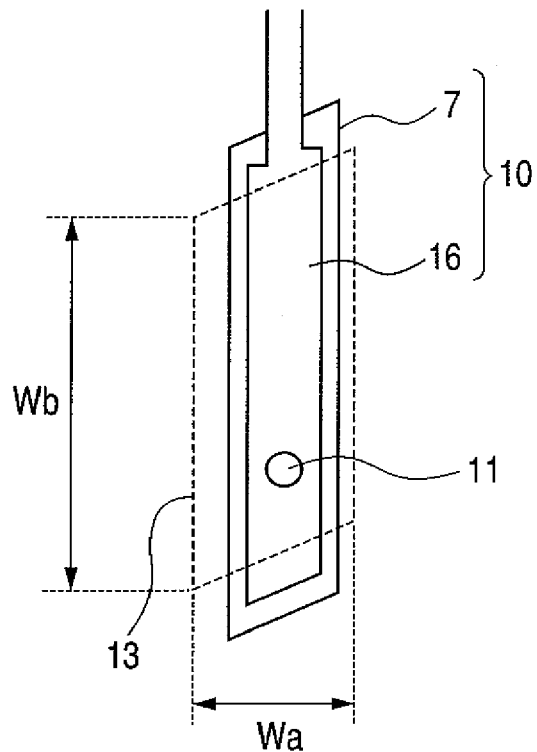
FIG. 15 is a schematic view of the liquid discharge head shown in FIG. 13 seen from an upper surface side (discharge port side).
Figure 16:
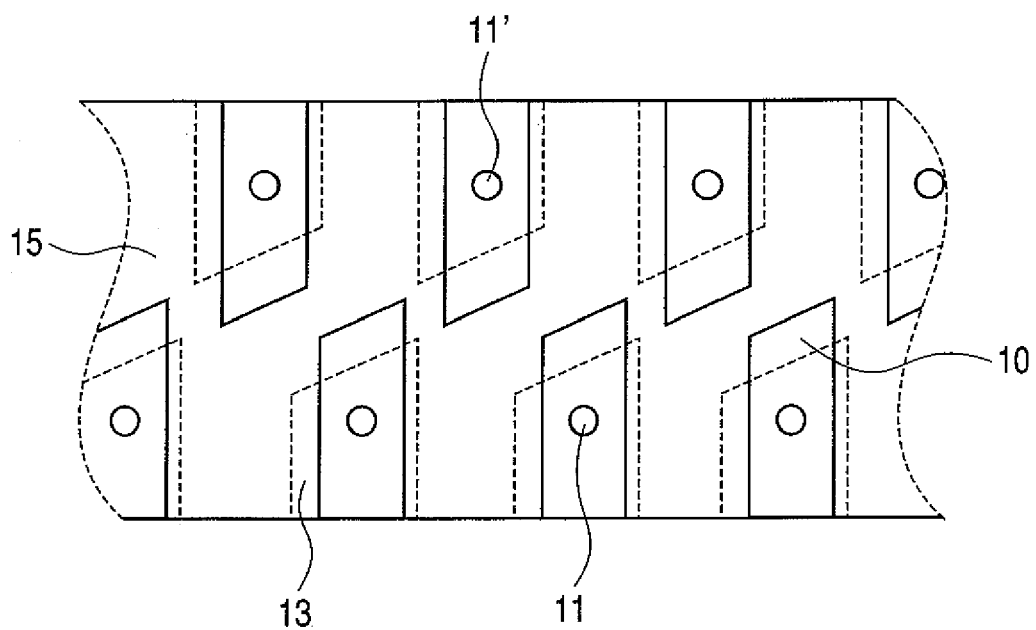
FIG. 16 is a schematic view of the liquid discharge head shown in FIG. 13 seen from the upper surface side (discharge port side).

FIGS. 15 and 16 are each a schematic view of the liquid discharge head shown in FIG. 13 seen from an upper surface side (side of the discharge ports 11). A region 13 indicated by a broken line shows the separate liquid chamber 13 to which a pressure is applied. The piezoelectric film elements 10 are formed on the separate liquid chambers 13 by appropriate patterning. For example, in FIG. 15, the lower electrode film 16 is drawn to a portion where the piezoelectric film 7 is not present, and the upper electrode film 18 (not shown) is drawn to the side opposite to the lower electrode film 16 so as to be connected to a driving source. FIGS. 15 and 16 each show a state where the lower electrode film 16 is patterned. Alternatively, as shown in FIG. 14, each of the lower electrode films 16 may be present in a portion where the piezoelectric substance 7 is not present. The piezoelectric bodies 7, the lower electrode films 16, and the upper electrode films 18 can be optimally patterned in accordance with purposes as long as a trouble such as a short circuit or disconnection does not occur between a drive circuit and each of the piezoelectric film elements 10 upon driving of the piezoelectric film elements 10. In addition, the shown shape of each of the separate liquid chambers 13 is a parallelogram because such shape is obtained when each separate liquid chamber is produced by performing wet etching with an alkali using an Si (110) substrate as a substrate. The shape of each of the separate liquid chambers 13 may be a rectangle or a square instead of the foregoing. In general, multiple separate liquid chambers 13 are produced on the vibration plate 15 at a constant pitch number. Alternatively, as shown in FIG. 16, the separate liquid chambers 13 may be arranged in a zigzag fashion, or the number of the separate liquid chamber 13 may be one depending on a purpose.

The thickness of the vibration plate 15 is typically 0.5 to 10 μm, or preferably 1.0 to 6.0 μm. The thickness includes the thickness of the above-mentioned buffer layer when the buffer layer 19 is present. Alternatively, multiple layers may be formed instead of the buffer layer. For example, the multiple layers may include an etch stop layer needed in the case where the vibration plate and each of the separate liquid chambers are formed of the same substrate. Each of the separate liquid chambers 13 has a width Wa (see FIG. 15) of typically 30 to 180 μm. Each of the chambers has a length Wb (see FIG. 15) of typically 0.3 to 6.0 mm, though the length varies depending on the amount of a liquid droplet to be discharged. Each of the discharge ports 11 typically has a circular shape or a star shape, and preferably has a diameter of 7 to 30 μm in ordinary cases. The sectional shape of each of the discharge ports 11 is preferably a taper shape expanding toward the corresponding communication hole 12. Each of the communication holes 12 preferably has a length of 0.05 mm to 0.5 mm in ordinary cases. When the length of each of the communication holes 12 is 0.5 mm or less, the speed at which a liquid droplet is discharged sufficiently increases. In addition, the length is preferably 0.05 mm or more because a variation in speed at which a liquid droplet is discharged among arbitrary discharge ports becomes small. In addition, members of which the vibration plate, the separate liquid chambers, the common liquid chamber, the communication holes, and the like constituting the liquid discharge head of the present invention are formed may be made of the same material, or may be made of materials different from each other. For example, Si and the like can be processed with good accuracy by employing a lithography method and an etching method. In addition, the different members to be selected are preferably made of materials whose coefficient of thermal expansion differ from each other by $1 \times 10^{-8}/°$ C. to $1 \times 10^{-6}/°$ C. For example, an SUS substrate, an Ni substrate, or the like is preferably selected for an Si substrate.

The piezoelectric film of the present invention is preferably an epitaxial film with a <100> orientation having at least a tetragonal. The crystal orientation in the film in-plane direction of the piezoelectric film in the liquid discharge head of the present invention preferably has a <100> orientation in the longitudinal direction of the piezoelectric film element. It should be noted that the longitudinal direction is the direction of Wb of FIG. 15.

Next, a method of producing a liquid discharge head of the present invention will be described. The method of producing a liquid discharge head of the present invention includes at least the steps of:

(1) forming a discharge port;

(2) forming a communication hole for establishing communication between the discharge port and the separate liquid chamber;

(3) forming a separate liquid chamber;

(4) forming a common liquid chamber in communication with the separate liquid chamber;

(5) forming a vibration plate for applying vibration to the separate liquid chamber; and (6) producing the piezoelectric film element of the present invention which is provided for the outside of the separate liquid chamber and which is used for applying vibration to the vibration plate.

To be specific, the following method can be exemplified as a first method of producing a liquid discharge head of the present invention. First, part of each of the separate liquid chambers and the vibration plate are formed by applying the step (3) to a substrate on which the piezoelectric film elements 10 have been formed by applying the above step (6). A base body in which the communication holes and the common liquid chamber have been formed by applying the steps (2) and (4), and a base body having the discharge ports by applying the step (1) are separately produced. Next, the above-mentioned substrate, and those base bodies are laminated and integrated with one another, whereby a liquid discharge head is produced.

In addition, the following method can be exemplified as a second method of producing a liquid discharge head of the present invention. First, at least a base body in which the separate liquid chambers are to be formed by applying the step (3) or a base body in which the separate liquid chamber has been formed by applying the step (3) is produced. Next, the piezoelectric film element, or the vibration plate and the piezoelectric film element, are transferred from a substrate on which the piezoelectric film element has been formed by applying the step (6) or from a substrate on which the vibration plate and the piezoelectric film element has been formed by applying the steps (5) and (6) onto the base body. Next, at least a base body portion on the side opposite to the piezoelectric film element or the like of the base body onto which the piezoelectric film element, or the vibration plate and the piezoelectric film element, have been transferred is processed by applying the step (2), whereby the separate liquid chamber is formed. Further, in the same manner as in the first method, a base body in which the communication holes and the common liquid chamber have been formed, and a base body in which the discharge ports have been formed are produced, and those base bodies are laminated and integrated with one another, whereby a liquid discharge head is produced.

Figure 17:
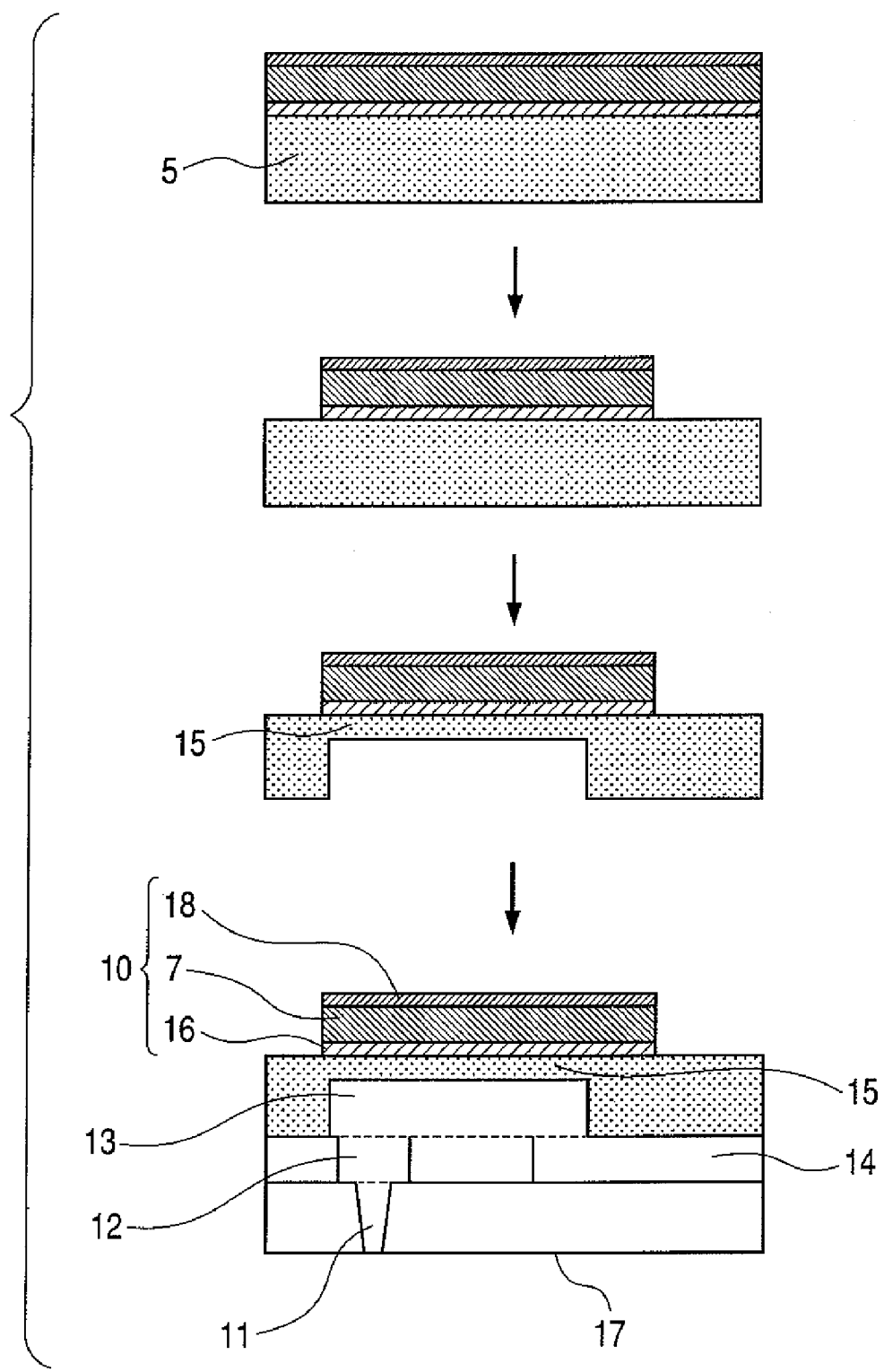
FIG. 17 is a schematic view showing an example of production steps of a liquid discharge head of the present invention.

An example of the first method is such a production method as shown in FIG. 17. First, the piezoelectric film elements 10 are provided on the substrate 5 in the same manner as in the method of producing a piezoelectric film element. Next, part of the substrate 5 is removed in at least a state where the piezoelectric film elements 10 are patterned, whereby part of each of the separate liquid chambers 13 is formed, and, at the same time, the vibration plate 15 is formed. A base body having the common liquid chamber 14 and the communication holes 12 is separately produced. Further, a base body in which the discharge ports 11 have been formed is produced. Further, the substrate, and the base bodies are laminated and integrated with one another, whereby a liquid discharge head is formed. Examples of a method of removing part of the substrate 5 include a wet etching method, a dry etching method, and a sand mill method. The removal of part of the substrate 5 by such the method results in the formation of the vibration plate 15 and at least part of each of the separate liquid chambers 13.

Figure 18:
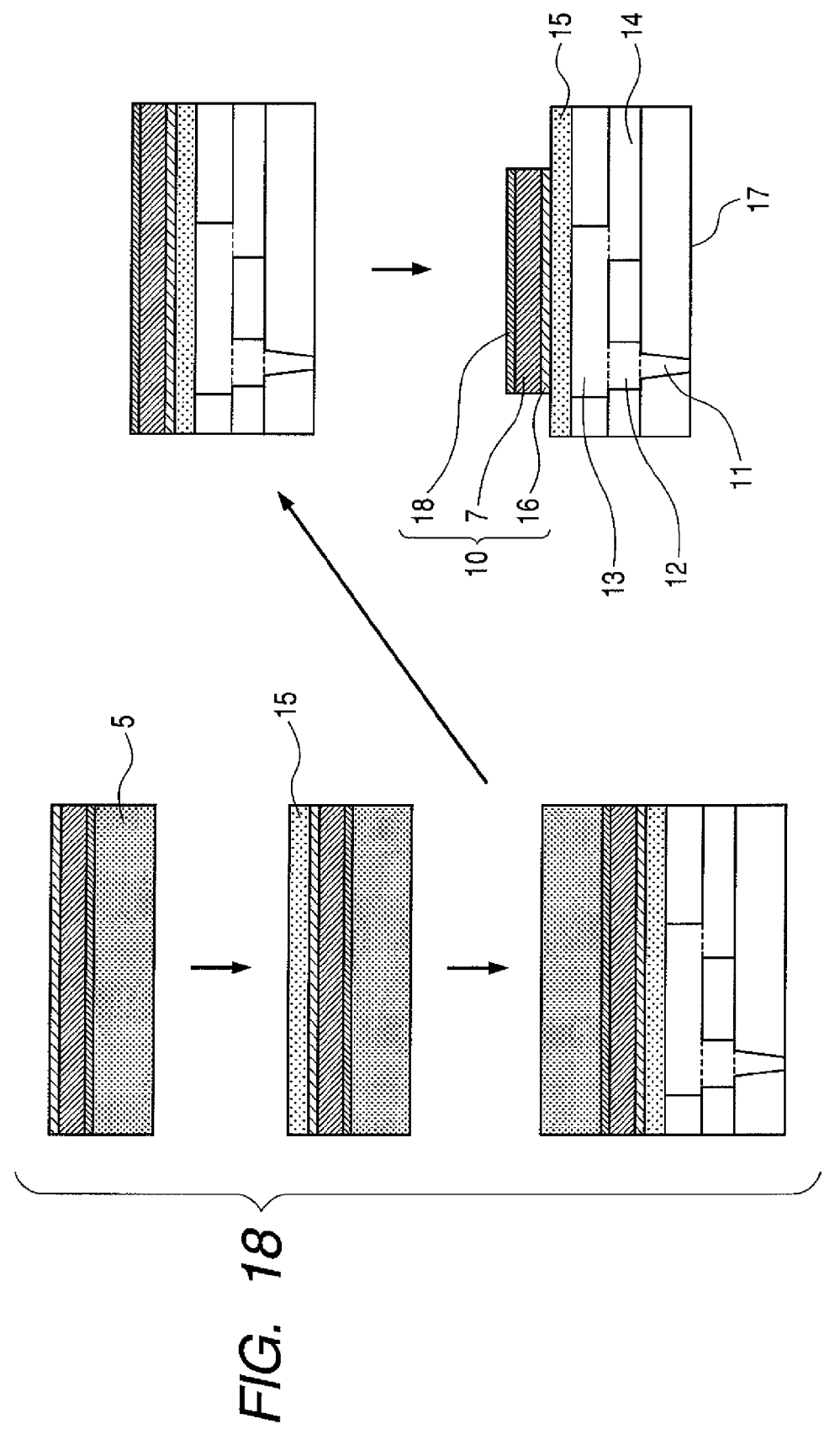
FIG. 18 is a schematic view showing an example of production steps of the liquid discharge head of the present invention.

An example of the second method is such a production method as shown in FIG. 18. First, the piezoelectric film elements 10 are provided on the substrate 5 in the same manner as in the method of producing a piezoelectric film element. Next, the substrate in which the vibration plate 15 has been formed on the piezoelectric film elements 10 is produced in a state where the piezoelectric film elements are not patterned. Further, a base body provided with the separate liquid chambers 13, a base body provided with the communication holes 12 and the common liquid chamber 14, a base body provided with the discharge ports 11, and the like are produced. After those base bodies have been laminated, the vibration plate, the piezoelectric film elements, and the like are transferred from the above-mentioned substrate.

Figure 19:
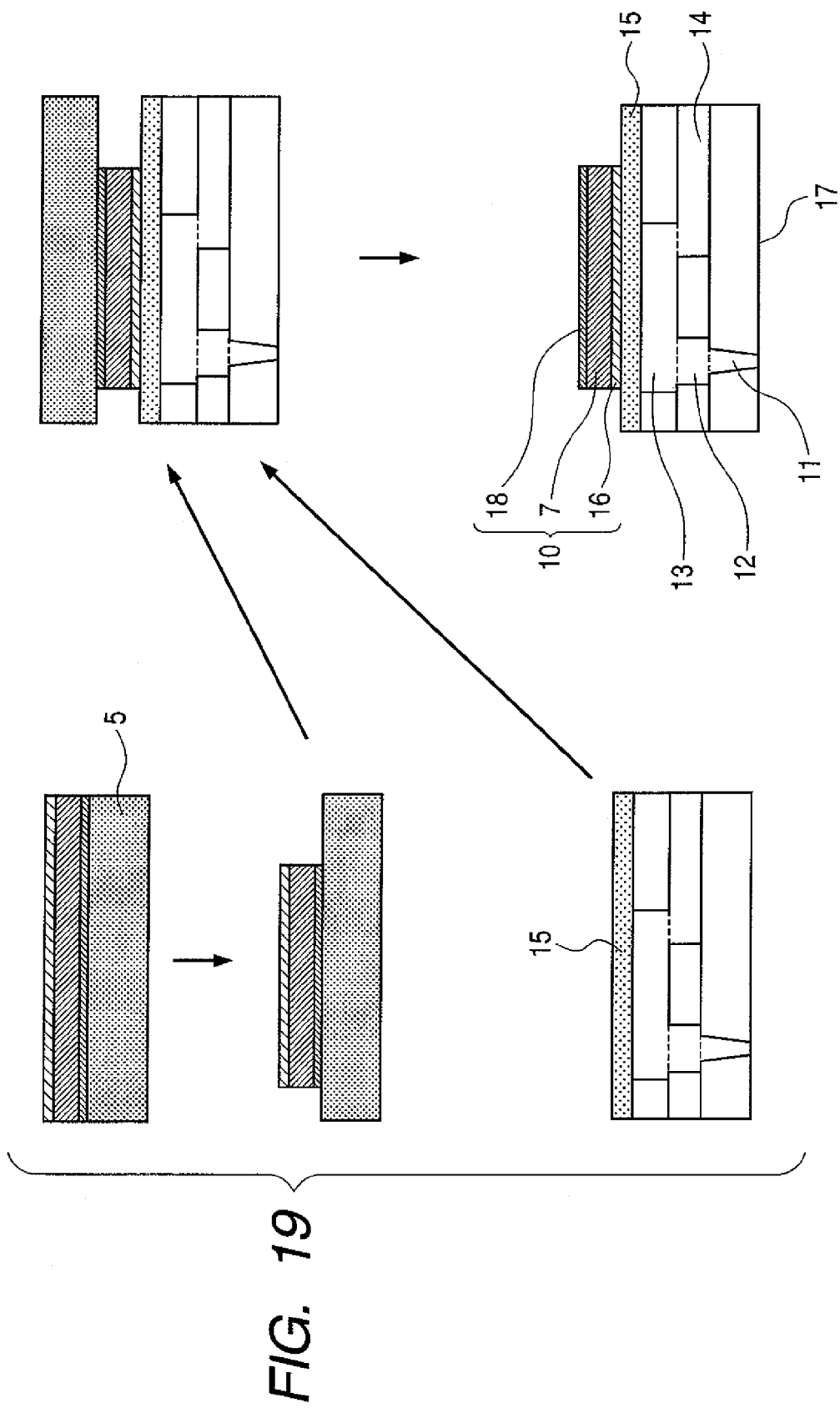
FIG. 19 is a schematic view showing an example of production steps of the liquid discharge head of the present invention.

Another example is such a production method as shown in FIG. 19. First, the piezoelectric film elements 10 are formed on the substrate 5, and are patterned, whereby the piezoelectric film elements are formed. A base body on which the vibration plate 15 has been provided and which is provided with part of each of the separate liquid chambers 13, a base body provided with the common liquid chamber 14 and the communication holes 12, and a base body in which the discharge ports 11 have been formed are separately produced. Then, those base bodies are laminated, and the piezoelectric film elements 10 are transferred from the substrate, whereby a liquid discharge head is formed.

A joining method upon transfer may be a method involving the use of an inorganic adhesive or an organic adhesive. However, a method involving metal joining using an inorganic material is more preferable than the former method. Examples of the material to be used in the metal joining include In, Au, Cu, Ni, Pb, Ti, Cr, and Pd. When any one of them is used, joining can be performed at a low temperature of 300° C. or lower, and a difference in coefficient of thermal expansion between any one of them and a substrate is small. As a result, a problem due to, for example, the warping of a piezoelectric film element when the length of the element is increased can be avoided, and damage to the piezoelectric film element is reduced.

Figure 20A:
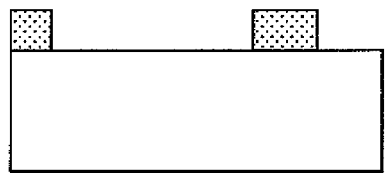
FIGS. 20A, 20B, 20C, 20D, 20E and 20F are each a schematic view showing an example of a production step of the liquid discharge head of the present invention.
Figure 20E:
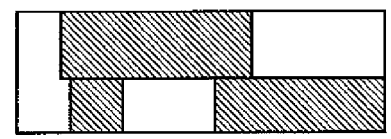
Figure 20B:
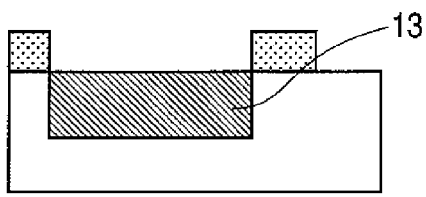
Figure 20F:
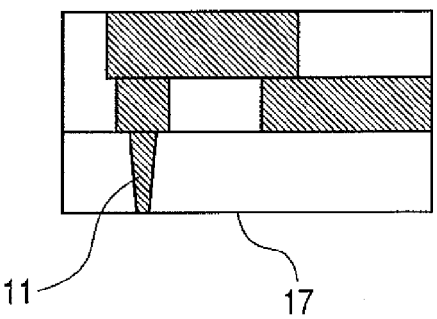
Figure 20C:
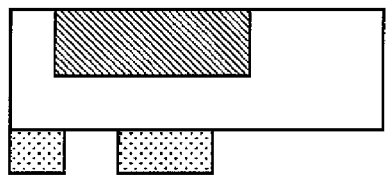
Figure 20D:
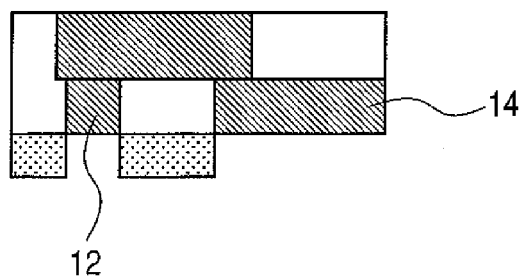

The communication holes 12 and the common liquid chamber 14 in the first method, and the separate liquid chambers 13, the communication holes 12, and the common liquid chamber 14 in the second method can be formed by processing, for example, a forming member (base body). A step of patterning the forming member (base body) by lithography and a step of removing part of the member by etching can be used in the processing. For example, in the case of the second method, the separate liquid chambers 13, the communication holes 12, and the common liquid chamber 14 are formed through the steps shown in FIGS. 20A to 20E. FIG. 20A shows a step of forming a mask for any one of the separate liquid chambers 13, and FIG. 20B shows a step of processing the separate liquid chamber 13 by etching or the like from an upper portion (a diagonal line portion represents a processed portion). In addition, FIG. 20C shows a step of removing the mask used in the formation of the separate liquid chamber 13 and forming a mask for any one of the communication holes 12 and the common liquid chamber 14, and FIG. 20D shows a step of processing the communication hole 12 and the common liquid chamber 14 by etching or the like from a lower portion. Further, FIG. 20E schematically shows a state where the mask used in the formation of the communication hole 12 and the common liquid chamber 14 is removed, and the separate liquid chamber 13, the communication hole 12, and the common liquid chamber 14 are formed. The discharge port 11 is formed by subjecting a base body 17 to, for example, etching, machining, or laser processing. FIG. 20F shows a state where, after the state showing in FIG. 20E, the base body 17 in which the discharge port 11 has been formed is joined to the base body in which the separate liquid chamber 13, the communication hole 12, and the common liquid chamber 14 have been formed. The surface of the base body 17 provided with the discharge port is preferably subjected to a water-repellent treatment. The respective base bodies can be joined by the same method as the joining method upon transfer. Alternatively, those base bodies may be joined by anodizing bonding.

A base body brought into the state shown in FIG. 20E or FIG. 20F is preferably used as another base body onto which the piezoelectric film elements 10 on the substrate 5 are to be transferred in the second method. Here, when a vibration plate has been formed on the piezoelectric film elements on the substrate 5, the elements are transferred directly onto the separate liquid chambers 13 each in the state shown in FIG. 20E or FIG. 20F. In addition, when no vibration plate has been formed on the piezoelectric film elements on the substrate 5, the holes of the separate liquid chambers 13 each in the state shown in FIG. 20E or FIG. 20F are filled with a resin so that a film of a vibration plate is formed, and then the resin is removed by etching so that the vibration plate is formed, followed by the transfer of the elements. In this case, the vibration plate is preferably formed by employing a thin film formation method such as a sputtering method or a CVD method. In addition, a step of forming the pattern of the piezoelectric film elements 10 may be performed before the transfer, or may be performed after the transfer.

Next, a liquid discharge apparatus of the present invention will be described. The liquid discharge apparatus of the present invention has the above-mentioned liquid discharge head of the present invention.

Figure 24:
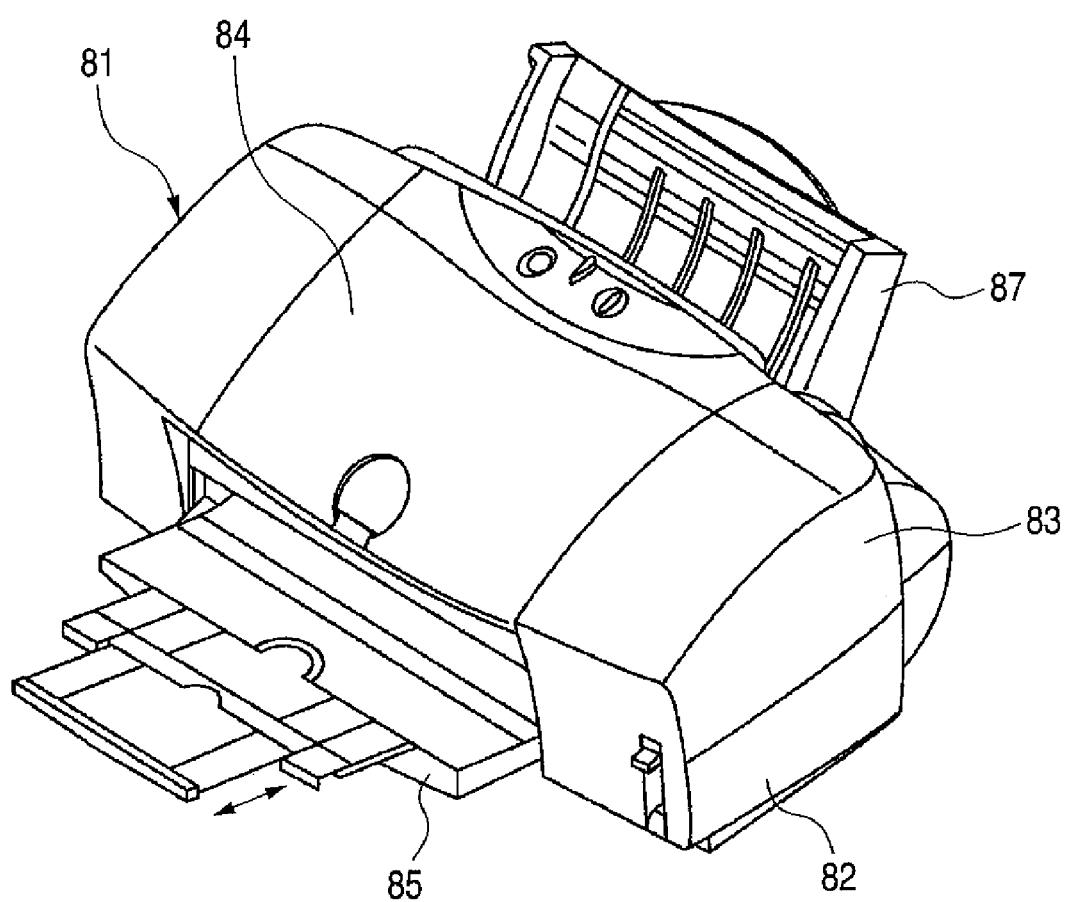
FIG. 24 is a perspective view showing an example of a liquid discharge apparatus.
Figure 25:
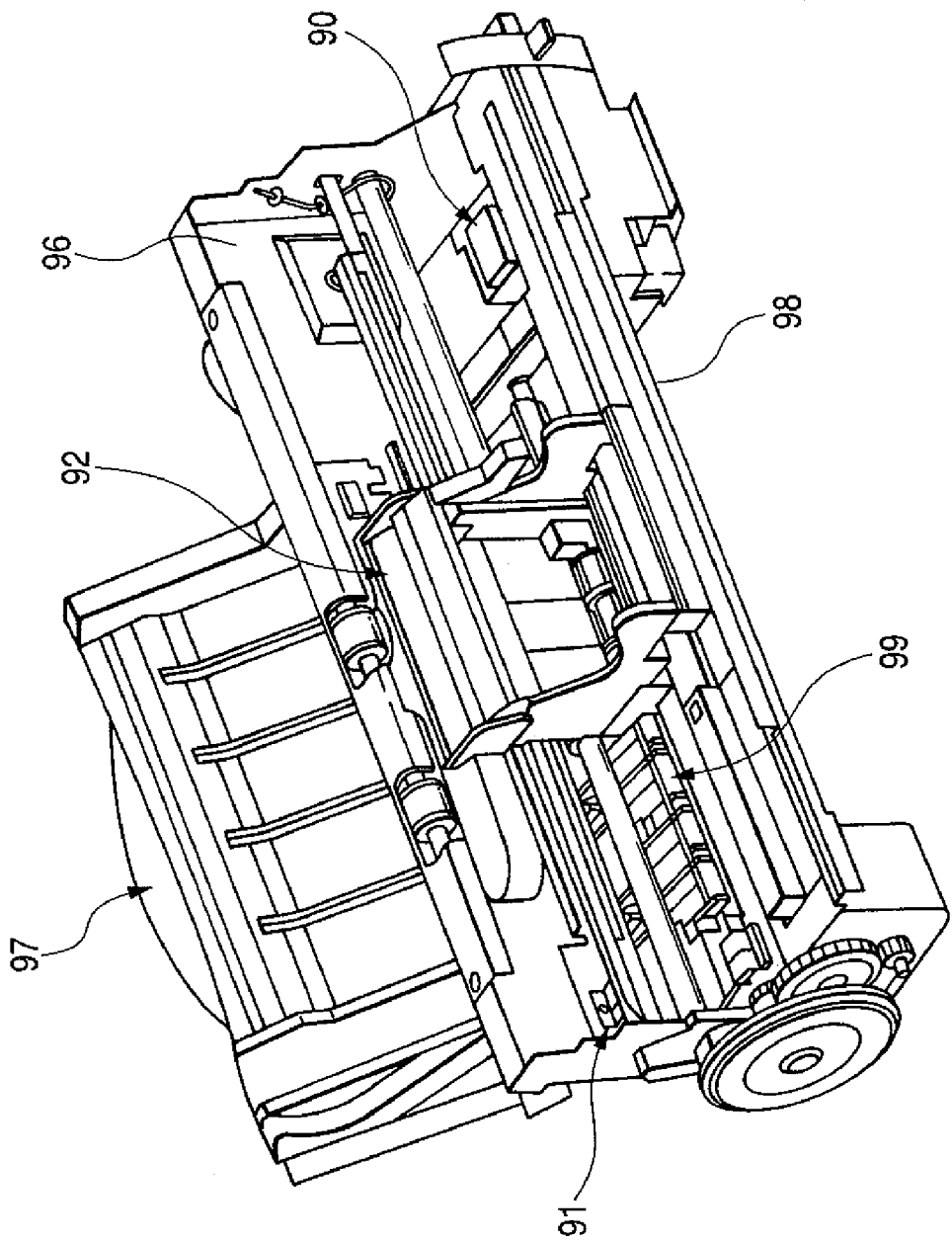
FIG. 25 is a perspective view showing an example of the liquid discharge apparatus.

An ink jet recording apparatus shown in each of FIGS. 24 and 25 can be exemplified as the liquid discharge apparatus of the present invention. FIG. 25 shows a state where external packagings 82 to 85 and 87 of a liquid discharge apparatus (ink jet recording apparatus) 81 shown in FIG. 24 are removed. The ink jet recording apparatus 81 has an automatic feeding portion 97 for automatically feeding recording paper as a recording medium into a apparatus main body 96. The apparatus further has: a conveying portion 99 for guiding the recording paper fed from the automatic feeding portion 97 to a predetermined recording position and for guiding the paper from the recording position to a discharge opening 98; a recording portion 91 for performing recording on the recording paper conveyed to the recording position; and a recovery portion 90 for performing a recovery treatment for the recording portion 91. The recording portion 91 is provided with a carriage 92 which stores the liquid discharge head of the present invention and is reciprocally transported on a rail.

In such the ink jet recording apparatus, a piezoelectric substance is displaced when the carriage 92 is transported on the rail in accordance with an electrical signal delivered from a computer and a driving voltage is applied to electrodes sandwiching the piezoelectric substance. Each piezoelectric chamber is pressurized by the displacement of the piezoelectric substance through the intermediation of the vibration plate 15, and then ink is discharged from the discharge ports 11, whereby printing is performed.

The liquid discharge apparatus of the present invention enables a liquid to be discharged uniformly at a high speed, and has achieved a reduction in size.

A printer has been exemplified above as an application of the liquid discharge apparatus of the present invention, but the liquid discharge apparatus can be applied to an industrial liquid discharge apparatus as well as an ink jet recording apparatus such as a facsimile, a multifunction machine, or a copying machine.

(Evaluation for Piezoelectric Property)

Figure 21:
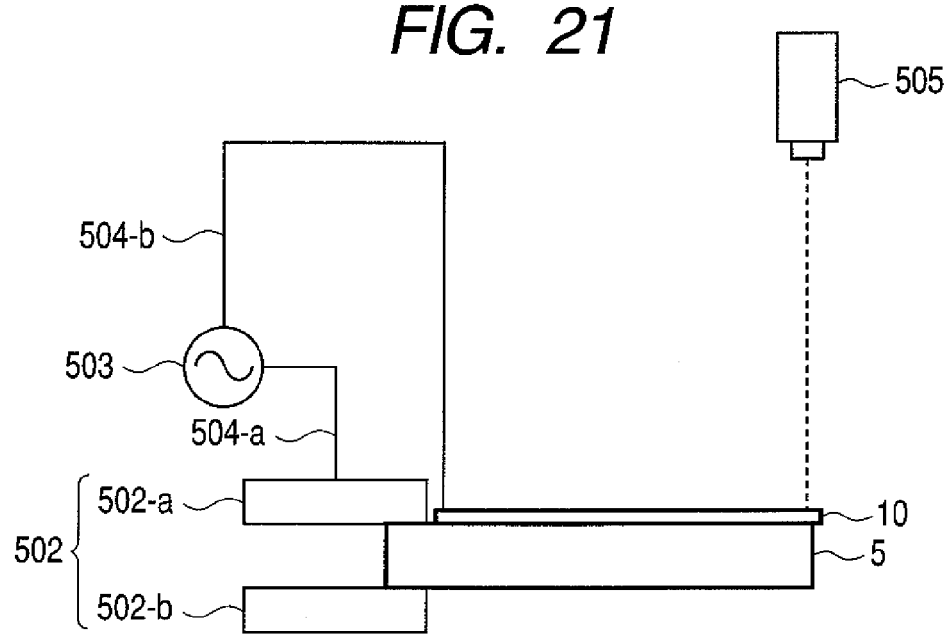
FIG. 21 is a schematic view showing a method for evaluation for piezoelectric property.
Figure 22:
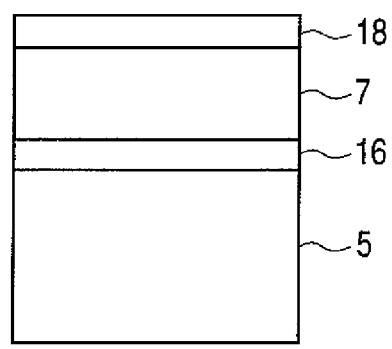
FIG. 22 is a schematic view showing the method for evaluation for the piezoelectric property.
Figure 23:
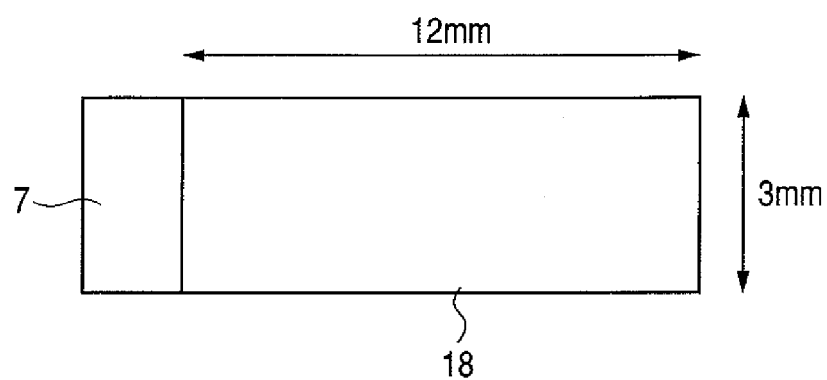
FIG. 23 is a schematic view showing the method for evaluation for the piezoelectric property.

The piezoelectric film element of the present invention was evaluated for piezoelectric property by a $d_{31}$ measurement method using a unimolph type cantilever mode. FIGS. 21 to 23 schematically show the measurement method and a measurement constitution.

The piezoelectric film element 10 having the lower electrode film 16, the piezoelectric film 7, and the upper electrode film 18 constituted in the stated order on the substrate 5 is constituted like a unimolph type cantilever in which one side of the element is fixed with a clamp jig 502. An upper portion 502-a of the clamp jig 502 is constituted by a conductive material, is brought into electrical contact with the lower electrode film 16 of the piezoelectric film 7, and is connected to one (not shown) of the output terminals of an AC power source 503 through an electric cable 504-a. The other one (not shown) of the output terminals of the AC power source 503 is connected to the upper electrode film 18 through an electric cable 504-b so that an alternating voltage can be applied to the piezoelectric film 7.

The piezoelectric film element 10 expands and contracts due to an electric field supplied from the AC power source 503. In association with the expansion and contraction, the substrate 5 is distorted, and the unimolph type cantilever vibrates vertically by using an end portion fixed with the clamp jig 502 as a fulcrum. In this case, the vibration of an unclamped end portion of the piezoelectric film element 10 is monitored with a laser Doppler velocimeter (LDV) 505 so that the displacement amount of the unimolph type cantilever with respect to an inputted electric field can be measured.

The displacement amount of the unimolph type cantilever with respect to an inputted voltage V in this case approximately satisfies the following equations 1 (see Non-patent Document 2: J. G. Smith, W. Choi, The constituent equations of piezoelectric heterogeneous bimorph, IEEE trans. Ultrason. Ferro. Freq. Control 38 (1991) 256-270:).

The equations 1 do not contain the terms of the physical property values of, for example, the lower electrode film, the upper electrode film, and any other buffer layer, but the physical property values and film thicknesses of such layers can be ignored when a substrate thickness hs is sufficiently small as compared to the thickness of each of the layers. As a result, the equations 1 are approximations good enough to be put into practical use.

Equations 1

$$\delta = -3d_{31}S_{11}{}^{s}S_{11}{}^{P}h^{s}(h^{s}+h^{P})L^{2}V/K \quad \text{Equation 1-1}$$

$$K=(S_{11}{}^{s})^{2}(h^{P})^{4}+4S_{11}{}^{s}S_{11}{}^{P}h^{s}(h^{P})^{3}+6S_{11}{}^{s}S_{11}{}^{P}(h^{s})^{2}(h^{P})^{2}+ \\ 4S_{11}{}^{s}S_{11}{}^{P}(h^{s})^{3}h^{P}+(S_{11}{}^{P})^{2}(h^{s})^{4} \quad \text{Equation 1-2}$$

δ: displacement amount of the tip of a cantilever
V: inputted voltage
L: cantilever length
$S_{11}{}^{S}$: substrate compliance (element of 11 direction)
$S_{11}{}^{P}$: piezoelectric substance compliance (element of 11 direction)
$h^{S}$: substrate thickness
$h^{P}$: piezoelectric substance thickness $d_{31}$ of the piezoelectric film element can be determined from the equations 1 by measuring the displacement amount of the unimolph type cantilever with respect to an inputted electric field.

EXAMPLES

Hereinafter, the piezoelectric film, piezoelectric film element, and the liquid discharge head using the piezoelectric film element of the present invention will be described by way of examples.

Example 1

An oxide film and a piezoelectric film of Example 1 were produced in accordance with the following procedure.

An SrRuO$_3$ (SRO) film having a film thickness of 200 nm was formed on an SrTiO$_3$ {100} substrate at a substrate temperature of 600° C. by a sputtering method, whereby a substrate having an SRO lower electrode film was obtained.

Next, PZT was formed into a piezoelectric film on the substrate by employing a pulse MOCVD method. A film formation method will be described below.

The temperature of the above-mentioned substrate was heated to 600° C. while the substrate was rotated at 8.3 rpm on a substrate holder of the apparatus shown in FIG. 9. Further, a Pb raw material gas was supplied at a rate of 5.8 cm³/min in such a manner that a ratio of the amount of a Zr raw material to the amount of Pb would be 0.14 to 0.15 and a ratio of the amount of a Ti raw material to the amount of Pb would be 0.85 to 0.86. After the above-mentioned raw material gas had been supplied for 12 seconds, no raw material was supplied for 8 seconds. The operation of the 20-second period was repeated, whereby a perovskite PZT epitaxial film having a film thickness of 2.0 μm was formed. The raw materials were subjected to bubbling for 70 minutes prior to the supply of the raw material gas.

Figure 11:
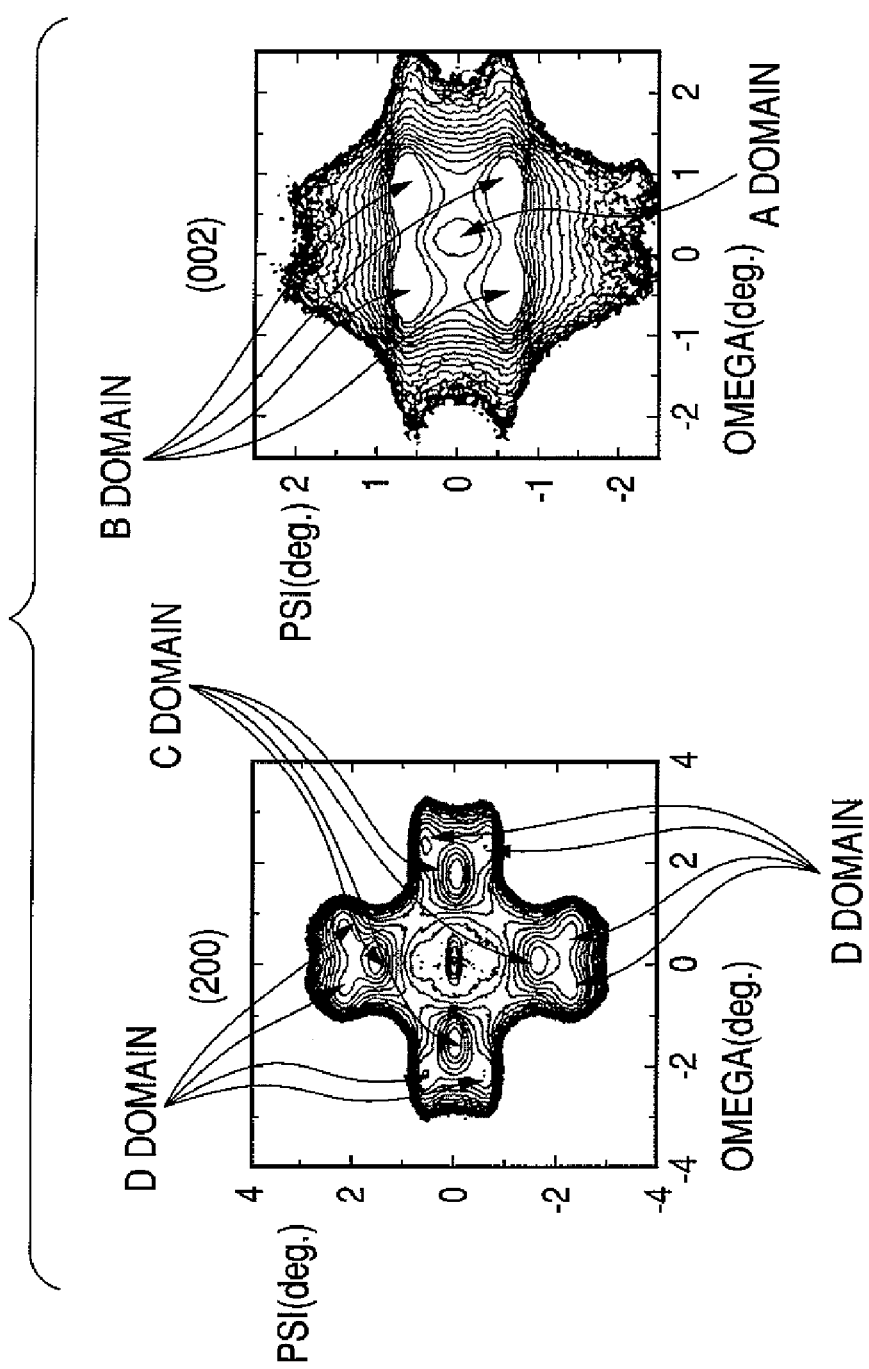
FIG. 11 is a view showing results of pole measurement by the X-ray diffraction of an epitaxial film having a PZT perovskite structure.

The compositional analysis of PZT by an inductively coupled plasma-optical emission spectrometer (ICP compositional analysis) showed that PZT had an element ratio Zr/(Zr/Ti) of 0.14. In addition, the 2θ/θ measurement of X-ray diffraction showed that only a reflection peak caused by the {00L} surface (L=1, 2, 3, . . . , n: n represents an integer) of the perovskite structure of PZT was detected. The pole measurement of an asymmetric surface {202} resulted in the appearance of four-fold symmetric reflection peak. The results confirmed that the piezoelectric film was an epitaxial film having a PZT perovskite structure with a <100> orientation. In addition, the pole measurement of (002) and (200) of PZT was similarly performed by X-ray diffraction (FIG. 11). As a result of the measurement, as shown in the figure, an A domain, a B domain, a C domain, and a D domain were observed. Here, it was found that: the B domain had a crystal orientation deviation of 0.6° with respect to the A domain; the D domain had a crystal orientation deviation of 0.6° with respect to the C domain; and the A domain and the C domain had a mirror image relation of a twin crystal by using {110} as a twin crystal plane. In addition, as can be seen from the figure, a diffraction point was observed at a position of 0° in each of the ω axis and ψ axis of the pole figure of (200) of PZT. However, whether the diffraction point was caused by the SrTiO$_3$ substrate, the SRO electrode, or the 90° domain structure of PZT could not be clearly understood. In addition, the reciprocal mapping of (004) and (204) of PZT corresponding to the A domain was similarly performed by X-ray diffraction at a temperature of 300 K. The result of the measurement confirmed that PZT was a tetragonal.

Further, Ti was formed into a film having a film thickness of 4 nm by a sputtering method to serve as an electrode film on the piezoelectric film. Then, Pt was formed into a film having a film thickness of 150 nm by a sputtering method to serve as an electrode film on the piezoelectric film, whereby a piezoelectric film element of Example 1 was produced.

Example 2

An oxide film and a piezoelectric film of Example 2 were produced in accordance with the following procedure.

The same SrTiO$_3$ substrate with an SRO lower electrode as the substrate used in Example 1 was used.

Only a Pb raw material and a Ti raw material were used as raw material gases, and the temperature of the substrate was heated to 600° C. in the same manner as in Example 1. The Ti raw material was supplied while a ratio of the amount of the Ti raw material to be supplied to the amount of the Pb raw material gas to be supplied was set to 0.94. The number of revolutions of the substrate was set to be equal to that of Example 1, but the Pb raw material gas was supplied at a rate of 6.1 cm$^3$/min. Film formation was performed while the time period for which the raw materials were supplied was set to 12 seconds and the time period for which no raw material was supplied was set to 6 seconds. The operation of the 18-second period was repeated, whereby an epitaxial film having a film thickness of 2.0 μm and having the perovskite structure of PbTiO$_3$ (PTO) was obtained.

The 2θ/θ measurement of X-ray diffraction showed that only a reflection peak caused by the {00L} surface (L=1, 2, 3, . . . , n: n represents an integer) of the perovskite structure of PTO was detected. The pole measurement of an asymmetric surface {202} resulted in the appearance of four-fold symmetric reflection peak. The results confirmed that the piezoelectric film was an epitaxial film having a PTO perovskite structure with a <100> orientation. The pole measurement of (002) and (200) of PTO was similarly performed by X-ray diffraction (FIG. 12). As a result of the measurement, as shown in the figure, an A domain, a B domain, a C domain, and a D domain were observed. Here, it was found that: the B domain had a crystal orientation deviation of 0.7° with respect to the A domain; the D domain had a crystal orientation deviation of 0.7° with respect to the C domain; and the A domain and the C domain had a mirror image relation of a twin crystal by using {110} as a twin crystal plane. In addition, as can be seen from the figure, a diffraction point was observed at a position of 0° in each of the ω axis and ψ axis of the pole figure of (200) of PTO. However, whether the diffraction point was caused by the SrTiO$_3$ substrate, the SRO electrode, or the 90° domain structure of PTO could not be clearly understood. In addition, the reciprocal mapping of (004) and (204) of PTO corresponding to the A domain was similarly performed by X-ray diffraction at a temperature of 300 K. The result of the measurement confirmed that PTO was a tetragonal.

Further, Ti was formed into a film having a film thickness of 4 nm by a sputtering method to serve as an electrode film on the piezoelectric film. Then, Pt was formed into a film having a film thickness of 150 nm by a sputtering method to serve as an electrode film on the piezoelectric film, whereby a piezoelectric film element of Example 2 was produced.

Comparative Example 1

An oxide film and a piezoelectric film of Comparative example 1 were produced in accordance with the following procedure.

Lead acetate as a Pb raw material, tetra-t-butoxy Zr as a Zr raw material, and tetraisopropoxy Ti as a Ti raw material were used on the same substrate as that of Example 1. Those raw materials were loaded into isopropanol in such a manner that the amount of lead would be 1.2 time equivalents and a ratio Zr/Ti would be 40/60. Methyl dibenzylamine was added as a stabilizer in such a manner that a ratio of methyl dibenzylamine to the total amount of the loaded raw materials would be 1 mol %. The mixture was subjected to a heat treatment at 50° C. for 2 hours, and then the resultant was applied by spin coating, whereby a PZT film having a film thickness of 2.0 μm was formed. An application step was performed 10 times because a film thickness per spin coating was 0.2 μm. After the application, the resultant was subjected to a preliminary heating treatment at 410° C., and was then subjected to a crystallization treatment at 600° C. The crystallization treatment was repeated. A heat treatment at 650° C. was performed as a final treatment instead of the crystallization treatment at 600° C., whereby a film of Comparative Example 1 was obtained.

The compositional analysis of PZT by an inductively coupled plasma-optical emission spectrometer (ICP compositional analysis) showed that PZT had an element ratio Zr/(Zr/Ti) of 0.40. In addition, the 2θ/θ measurement of X-ray diffraction showed that only a reflection peak caused by the {00L} surface (L=1, 2, 3, . . . , n: n represents an integer) of the perovskite structure of PZT was detected. The pole measurement of an asymmetric surface {202} resulted in the appearance of four-fold symmetric reflection peak. The results confirmed that the piezoelectric film was an epitaxial film having a PZT perovskite structure with a <100> orientation. In addition, the pole measurement of (002) and (200) of PTO was similarly performed by X-ray diffraction. As a result of the measurement, a diffraction point was observed at a position of 0° in each of the ω axis and ψ axis of the pole figure of (200) and (002). That is, only the diffraction point caused by the A domain and the 90° domain structure shown in FIG. 11 were observed. In addition, the reciprocal mapping of (004) and (204) of PZT corresponding to the A domain was similarly performed by X-ray diffraction at a temperature of 300 K. The result of the measurement confirmed that PZT was a tetragonal. Further, Ti was formed into a film having a film thickness of 4 nm by a sputtering method to serve as an electrode film on the piezoelectric film. Then, Pt was formed into a film having a film thickness of 150 nm by a sputtering method to serve as an electrode film on the piezoelectric film, whereby a piezoelectric film element of Comparative Example 1 was produced.

Table 1 shows the results of the measurement of the piezoelectric constant of each of the piezoelectric film elements of Examples 1 and 2 and Comparative Example 1. The piezoelectric constant was measured by a $d_{31}$ measurement method using a unimolph type cantilever mode. A sample for $d_{31}$ measurement was produced by: processing the upper electrode 18 of each piezoelectric film element into a rectangular pattern having size of 12 mm by 3 mm; and cutting the processed electrode into a shape shown in FIG. 23 with a dicer. In this case, the upper electrode 18 was arranged in such a manner that each side of the rectangle of the electrode would be parallel to the <100> direction of the SrTiO$_3$ {100} substrate of each of Examples 1 and 2 and Comparative Example 1 in the piezoelectric film element on the SrTiO$_3$ {100} substrate.

$d_{31}$ of this example was determined under the following conditions.

An sine wave of 500 Hz was applied to the piezoelectric film element 10 in such a manner that an electric field of 0 to 150 [kV/cm] [a application of a voltage of 0 to 45 V to a film thickness of 3 μm of the piezoelectric film] would be applied as an input signal voltage to a sample. Then, $d_{31}$ was determined by measuring the displacement amount δ of the tip of the cantilever obtained for the input signal voltage.

The selected polarity of the voltage was such that displacement would be maximum in a certain electric field. The reason why the Sine wave was adopted as an input signal voltage was that the displacement 5 of the tip of the cantilever was intended to eliminate an inertial term of a vibrational motion because the mass of the cantilever was large.

The following physical property values were used in Table 1.

$S_{11}{}^S = 3.8 \times 10^{-12}$ [m$^2$/N]

$S_{11}{}^P = 10.0 \times 10^{-12}$ [m$^2$/N]

TABLE 1

|  | Example 1 | Example 2 | Comparative Example 1 |
|---|---|---|---|
| Piezoelectric constant (pC/N) | −169 | −158 | −70 |

As shown in Table 1, each of the piezoelectric film elements of Examples 1 and 2 was able to realize high piezoelectricity.

Example 3

Next, a liquid discharge head of Example 3 was produced in accordance with the following procedure.

An SOI substrate in which an epitaxial Si film having a thickness of 500 nm and an SiO$_2$ layer having a thickness of 500 nm had been formed was used as a substrate. After the surface of the Si {100} substrate had been treated with hydrofluoric acid, a ZrO$_2$ film doped with Y and having a thickness of 100 nm was formed by a sputtering method at a substrate temperature of 800° C. Subsequently, a CeO$_2$ film having a thickness of 60 nm was formed at a substrate temperature of 600° C. Each of the films was a single crystal film with a <100> orientation. Further, an LaNiO$_3$ (LNO) film having a thickness of 100 nm was formed as a lower electrode film on the resultant by a sputtering method at a substrate temperature of 300° C. Further, an SrRuO$_3$ (SRO) film having a thickness of 200 nm was formed on the LNO film at a substrate temperature of 600° C., whereby a substrate having the lower electrode film and the like was obtained. Each of the electrode film and the SRO film was also a single crystal film with a <100> orientation.

Next, a piezoelectric film element was produced in the same manner as in Example 1 except that the substrate having the lower electrode film and the like described above was used. After an actuator portion had been patterned, the Si substrate of a handle layer was subjected to dry etching by an inductively coupled plasma method (ICP method), whereby a vibration plate and separate liquid chambers were formed. Next, another Si substrate in which a common liquid chamber and communication holes had been formed was stuck to the resultant, and furthermore, a substrate in which discharge ports had been formed was stuck to the Si substrate in which the common liquid chamber and the communication holes had been formed. Thus, a liquid discharge head composed of the SiO$_2$ layer as a vibration plate, the Si film, the ZrO$_2$ film doped with Y, and the CeO$_2$ film was produced. A driving signal was applied to the liquid discharge head to drive the head. Then, the central portion of each of the separate liquid chambers of the liquid discharge head was irradiated with laser of 20 μmφ from an upper electrode side, and the liquid discharge head was evaluated for displacement amount by using a laser Doppler displacement system. As a result, the obtained displacement of the liquid discharge head of this example was as large as 0.18 μm. In addition, the liquid discharge head showed displacement having good followability even after the application of a driving signal of 10$^8$ times.

Example 4

An oxide film and a piezoelectric film of Example 4 were produced in accordance with the following procedure.

An SOI substrate in which an epitaxial Si film having a thickness of 500 nm and an SiO$_2$ layer having a thickness of 500 nm had been formed was used as a substrate. After the surface of the Si {100} substrate had been treated with hydrofluoric acid, a ZrO$_2$ film doped with Y and having a thickness of 100 nm was formed by a sputtering method at a substrate temperature of 800° C. Subsequently, a CeO$_2$ film having a thickness of 60 nm was formed at a substrate temperature of 600° C. Each of the films was a single crystal film with a <100> orientation. Further, an LaNiO$_3$ (LNO) film having a thickness of 100 nm was formed as a lower electrode film on the resultant by a sputtering method at a substrate temperature of 300° C. Further, an SrRuO$_3$ (SRO) film having a thickness of 200 nm was formed on the LNO film at a substrate temperature of 600° C., whereby a substrate having the lower electrode film and the like was obtained. Each of the electrode film and the SRO film was also a single crystal film with a <100> orientation. Next, an epitaxial film having a film thickness of 1.0 μm and having the perovskite structure of PbTiO$_3$ (PTO) was obtained under conditions identical to those of Example 2.

Figure 31:
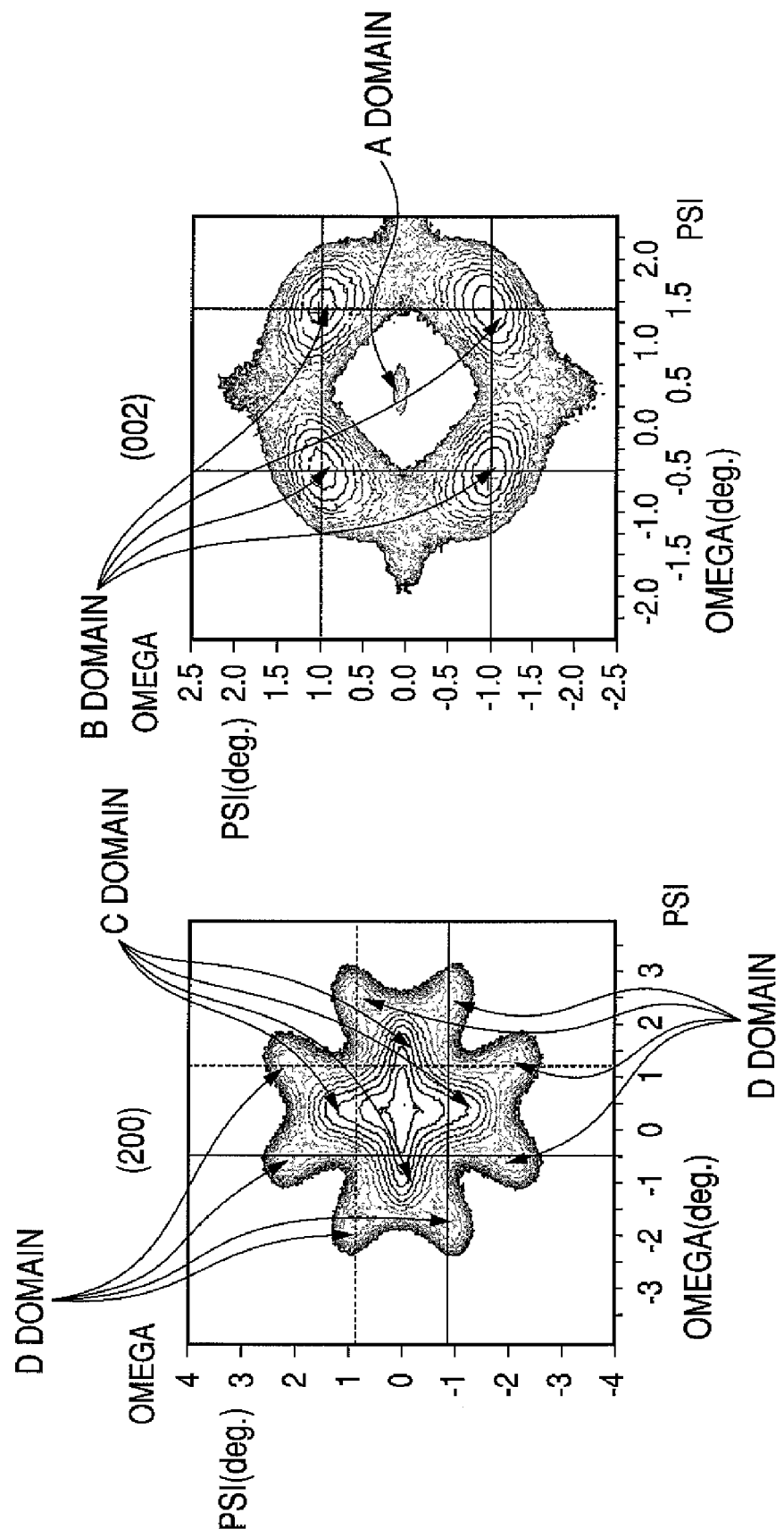
FIG. 31 is a view showing results of the pole measurement of (002) and (200) of PTO in a case where each of Si and KTO is used in the substrate.

The 2θ/θ measurement of X-ray diffraction showed that only a reflection peak caused by the {00L} surface (L=1, 2, 3, . . . , n: n represents an integer) of the perovskite structure of PTO was detected. The pole measurement of an asymmetric surface {202} resulted in the appearance of four-fold symmetric reflection peak. The results confirmed that the piezoelectric film was an epitaxial film having a PTO perovskite structure with a <100> orientation. In addition, the pole measurement of (002) and (200) of PTO was similarly performed by X-ray diffraction (FIG. 31). As a result of the measurement, as shown in the figure, an A domain, a B domain, a C domain, and a D domain were observed. Here, it was found that: the B domain had a crystal orientation deviation of 1.0° with respect to the A domain; the D domain had a crystal orientation deviation of 1.0° with respect to the C domain; and the A domain and the C domain had a mirror image relation of a twin crystal by using {110} as a twin crystal plane. In addition, as can be seen from the figure, a diffraction point was observed at a position of 0° in each of the ω axis and ψ axis of the pole figure of (200) of PTO. However, whether the diffraction point was caused by the SRO electrode or the 90° domain structure of PTO could not be clearly understood. In addition, the reciprocal mapping of (004) and (204) of PTO corresponding to the A domain was similarly performed by X-ray diffraction at a temperature of 300 K. The result of the measurement confirmed that PTO was a tetragonal.

Example 5

An oxide film and a piezoelectric film of Example 5 were produced in accordance with the following procedure.

An SrRuO$_3$ (SRO) film having a film thickness of 200 nm was formed on a KTaO$_3$ (potassium tantalate: KTO) {100} substrate at a substrate temperature of 600° C. by a sputtering method, whereby a substrate having an SRO lower electrode film was obtained. Next, an epitaxial film having a film thickness of 1.0 μm and having the perovskite structure of PbTiO$_3$ (PTO) was obtained under conditions identical to those of Example 2.

The 2θ/θ measurement of X-ray diffraction showed that only a reflection peak caused by the {00L} surface (L=1, 2, 3, . . . , n: n represents an integer) of the perovskite structure of PTO was detected. The pole measurement of an asymmetric surface {202} resulted in the appearance of four-fold symmetric reflection peaks.

The results confirmed that the piezoelectric film was an epitaxial film having a PTO perovskite structure with a <100> orientation. In addition, the pole measurement of (002) and (200) of PTO was similarly performed by X-ray diffraction (FIG. 31). As a result of the measurement, as shown in the figure, an A domain, a B domain, a C domain, and D domain were observed. Here, it was found that: the B domain had a crystal orientation deviation of 1.0° with respect to the A domain; the D domain had a crystal orientation deviation of 1.0° with respect to the C domain; and the A domain and the C domain had a mirror image relation of a twin crystal by using {110} as a twin crystal plane. In addition, as can be seen from the figure, a diffraction point was observed at a position of 0° in each of the ω axis and ψ axis of the pole figure of (200) of PTO. However, whether the diffraction point was caused by the SRO electrode or the 90° domain structure of PTO could not be clearly understood. In addition, the reciprocal mapping of (004) and (204) of PTO corresponding to the A domain was similarly performed by X-ray diffraction at a temperature of 300° K. The result of the measurement confirmed that PTO was a tetragonal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2005-257133 filed Sep. 5, 2005, No. 2006-076667 filed Mar. 20, 1006, and No. 2006-231238 filed Aug. 28, 2006, which are hereby incorporated by reference herein in their entirety.

What is claimed is:

1. An epitaxial oxide film with a <100> orientation having at least a tetragonal, the epitaxial oxide film being composed of a perovskite composite oxide represented by a general formula ABO$_3$, the epitaxial oxide film comprising at least an A domain, a B domain, a C domain, and a D domain having a crystal orientation deviation with respect to one another, wherein:
   each of the A domain and the B domain has a [001] orientation and each of the C domain and the D domain has a [100] orientation;
   the A domain and the C domain have at least a mirror image relation of a twin crystal, and a twin crystal plane of the twin crystal is {110}; and
   the B domain and the D domain have at least a minor image relation of a twin crystal, and a twin crystal plane of the twin crystal is {110}.

2. An epitaxial oxide film according to claim 1, wherein a crystal orientation deviation between the A domain and the B domain is less than 5° and a crystal orientation deviation between the C domain and the D domain is less than 5°.

3. An epitaxial oxide film according to claim 1, wherein a crystal orientation deviation between the A domain and the B domain is less than 2° and a crystal orientation deviation between the C domain and the D domain is less than 2°.

4. An epitaxial oxide film according to claim 3, wherein the epitaxial oxide film is mainly composed of one of lead titanate and lead zirconate titanate.

5. An epitaxial oxide film according to claim 1, wherein, when the crystal orientation deviation between the A domain and the B domain is represented by X° and the crystal orientation deviation between the C domain and the D domain is represented by Y°, a relationship of X=Y is satisfied.

6. An epitaxial oxide film according to claim 1, with a <100> orientation and having at least a tetragonal, wherein, when a rotational deviation in a film in-plane direction between a vector component in the film in-plane direction of a [100] orientation of the A domain and a vector component in the film in-plane direction of a [001] orientation of the B domain is represented by V°, and a rotational deviation in the film in-plane direction between a vector component in the in-plane direction of a [001] orientation of the C domain and a vector component in the film in-plane direction of a [100] orientation of the D domain is represented by W°, a relationship of 0<V=W≦45 is satisfied.

7. An epitaxial oxide film according to claim 1, wherein the epitaxial oxide film has a film thickness of 0.6 μm or more.

8. A piezoelectric film composed of an epitaxial oxide film composed of a perovskite composite oxide represented by a general formula ABO$_3$, the epitaxial oxide film comprising at least an A domain and a B domain having a crystal orientation deviation with respect to each other,
   wherein the crystal orientation deviation between the A domain and the B domain is more than 0° and less than 5°, and
   wherein domains arranged in different positions in the piezoelectric film with respect to one another are defined as the same domain if one of the following conditions is satisfied:
   (1) lattice constants of the domains are the same and crystal orientations of the domains are the same, and
   (2) lattice constants of the domains are the same and angles from the thickness direction of the piezoelectric film to the respective crystal orientations of the domains are the same.

9. A piezoelectric film according to claim 8, further comprising a C domain and a D domain in addition to the A domain and the B domain in the epitaxial oxide film, wherein:
   the C domain and the D domain have a crystal orientation deviation with respect to each other, and
   the crystal orientation deviation between the C domain and the D domain is less than 5°.

10. A piezoelectric film according to claim 8, wherein the crystal orientation deviation between the A domain and the B domain is less than 2°.

11. A piezoelectric film according to claim 10, further comprising a C domain and a D domain in addition to the A domain and the B domain in the epitaxial oxide film, wherein:
   the C domain and the D domain have a crystal orientation deviation with respect to each other, and
   the crystal orientation deviation between the C domain and the D domain is less than 2°.

12. A piezoelectric film composed of an epitaxial oxide film with a <100> orientation having at least a tetragonal and a perovskite composite oxide represented by a general formula ABO$_3$, the epitaxial oxide film comprising at least an A domain, a B domain, a C domain, and a D domain having a crystal orientation deviation with respect to one another, wherein:

each of the A domain and the B domain has a [001] orientation and each of the C domain and the D domain has a [100] orientation;

the A domain and the C domain have at least a mirror image relation of a twin crystal, and a twin crystal plane of the twin crystal is {110}; and the B domain and the D domain have at least a minor image relation of a twin crystal, and a twin crystal plane of the twin crystal is {110}.

13. A piezoelectric film according to claim 12, wherein a crystal orientation deviation between the A domain and the B domain is less than 5° and a crystal orientation deviation between the C domain and the D domain is less than 5°.

14. A piezoelectric film according to claim 12, wherein a crystal orientation deviation between the A domain and the B domain is less than 2° and a crystal orientation deviation between the C domain and the D domain is less than 2°.

15. A piezoelectric film according to claim 10, wherein the epitaxial oxide film is mainly composed of one of lead titanate and lead zirconate titanate.

16. A piezoelectric film according to claim 14, wherein the epitaxial oxide film is mainly composed of one of lead titanate and lead zirconate titanate.

17. A piezoelectric film according to claim 12, wherein, when the crystal orientation deviation between the A domain and the B domain is represented by X° and the crystal orientation deviation between the C domain and the D domain is represented by Y°, a relationship of X=Y is satisfied.

18. A piezoelectric film according to claim 12 composed of the epitaxial oxide film with a <100> orientation having at least a tetragonal, wherein, when a rotational deviation in a film in-plane direction between a vector component in the film in-plane direction of a [100] orientation of the A domain and a vector component in the film in-plane direction of a [001] orientation of the B domain is represented by V°, and a rotational deviation in the film in-plane direction between a vector component in the in-plane direction of a [001] orientation of the C domain and a vector component in the film in-plane direction of a [100] orientation of the D domain is represented by W°, a relationship of 0<V=W≦45 is satisfied.

19. A piezoelectric film according to claim 8, further comprising a 90° domain structure.

20. A piezoelectric film according to claim 12, wherein a film thickness is 0.6 μm or more.

21. A piezoelectric film element, comprising:
    a piezoelectric film composed of an epitaxial oxide film with a <100> orientation having at least a tetragonal; and
    a pair of electrodes in contact with the piezoelectric film, wherein:
    the piezoelectric film is composed of a perovskite composite oxide represented by a general formula ABO$_3$, and has at least an A domain, a B domain, a C domain, and a D domain having a crystal orientation deviation with respect to one another;
    each of the A domain and the B domain has a [001] orientation and each of the C domain and the D domain has a [100] orientation;
    the A domain and the C domain have at least a mirror image relation of a twin crystal, and a twin crystal plane of the twin crystal is {110}; and
    the B domain and the D domain have at least a minor image relation of a twin crystal, and a twin crystal plane of the twin crystal is {110}.

22. A liquid discharge head, comprising:
    a discharge port;
    a separate liquid chamber in communication with the discharge port;
    a piezoelectric substrate element provided in correspondence with the separate liquid chamber; and
    a vibration plate provided between the separate liquid chamber and the piezoelectric substrate element,
    the liquid discharge head discharging a liquid in the separate liquid chamber from the discharge port due to a volume change in the separate liquid chamber caused by the vibration plate, wherein:
    the piezoelectric substrate element has a piezoelectric film composed of an epitaxial oxide film with a <100> orientation having at least a tetragonal, and a pair of electrodes in contact with the piezoelectric film;
    the piezoelectric film is composed of a perovskite composite oxide represented by a general formula ABO$_3$, and has at least an A domain, a B domain, a C domain, and a D domain having a crystal orientation deviation with respect to one another;
    each of the A domain and the B domain has a [001] orientation and each of the C domain and the D domain has a [100] orientation;
    the A domain and the C domain have at least a mirror image relation of a twin crystal, and a twin crystal plane of the twin crystal is {110}; and
    the B domain and the D domain have at least a mirror image relation of a twin crystal, and a twin crystal plane of the twin crystal is {110}.

23. A liquid discharge apparatus, comprising a liquid discharge head including:
    a discharge port;
    a separate liquid chamber in communication with the discharge port;
    a piezoelectric substrate element provided in correspondence with the separate liquid chamber; and
    a vibration plate provided between the separate liquid chamber and the piezoelectric substrate element,
    the liquid discharge head discharging a liquid in the separate liquid chamber from the discharge port due to a volume change in the separate liquid chamber caused by the vibration plate, wherein:
    the piezoelectric substrate element has a piezoelectric film composed of an epitaxial oxide film with a <100> orientation having at least a tetragonal, and a pair of electrodes in contact with the piezoelectric film;
    the piezoelectric film is composed of a perovskite composite oxide represented by a general formula ABO$_3$, and has at least an A domain, a B domain, a C domain, and a D domain having a crystal orientation deviation with respect to one another;
    each of the A domain and the B domain has a [001] orientation and each of the C domain and the D domain has a [100] orientation;
    the A domain and the C domain have at least a mirror image relation of a twin crystal, and a twin crystal plane of the twin crystal is {110}; and
    the B domain and the D domain have at least a minor image relation of a twin crystal, and a twin crystal plane of the twin crystal is {110}.

* * * * *